(12) United States Patent
Cooke

(10) Patent No.: US 10,395,963 B2
(45) Date of Patent: Aug. 27, 2019

(54) ELECTROSTATIC CHUCK

(71) Applicant: Entegris, Inc., Billerica, MA (US)

(72) Inventor: Richard A. Cooke, Framingham, MA (US)

(73) Assignee: ENTEGRIS, INC., Billerica, MA (US)

( * ) Notice: Subject to any disclaimer, the term of this patent is extended or adjusted under 35 U.S.C. 154(b) by 264 days.

(21) Appl. No.: 15/294,950

(22) Filed: Oct. 17, 2016

(65) Prior Publication Data

US 2017/0098568 A1 Apr. 6, 2017

Related U.S. Application Data

(63) Continuation of application No. 12/454,336, filed on May 15, 2009, now Pat. No. 9,543,187.

(60) Provisional application No. 61/054,259, filed on May 19, 2008, provisional application No. 61/094,700, filed on Sep. 5, 2008.

(51) Int. Cl.
*H01L 21/683* (2006.01)
*H01L 21/687* (2006.01)
*H02N 13/00* (2006.01)

(52) U.S. Cl.
CPC ...... *H01L 21/6833* (2013.01); *H01L 21/6831* (2013.01); *H01L 21/6875* (2013.01); *H02N 13/00* (2013.01)

(58) Field of Classification Search
CPC ............. H01L 21/6833; H01L 21/6831; H01L 21/6875
See application file for complete search history.

(56) References Cited

U.S. PATENT DOCUMENTS

| 4,184,188 A | 1/1980 | Briglia |
| 5,179,498 A | 1/1993 | Hongoh et al. |
| 5,250,137 A | 10/1993 | Arami et al. |
| 5,310,453 A | 5/1994 | Fukasawa et al. |
| 5,350,479 A | 9/1994 | Collins et al. |
| 5,382,311 A | 1/1995 | Ishikawa et al. |

(Continued)

FOREIGN PATENT DOCUMENTS

| CN | 1988128 A | 6/2007 |
| CN | 101043018 | 9/2007 |

(Continued)

OTHER PUBLICATIONS

Toshiya Watanabe et al 1992 Jpn. J. Appl. Phys. 31 2145 (Year: 1992).*

(Continued)

*Primary Examiner* — Scott Bauer
(74) *Attorney, Agent, or Firm* — Entegris, Inc.

(57) ABSTRACT

In accordance with an embodiment of the invention, there is provided an electrostatic chuck comprising an electrode, and a surface layer activated by a voltage in the electrode to form an electric charge to electrostatically clamp a substrate to the electrostatic chuck. The surface layer includes a plurality of protrusions extending to a height above portions of the surface layer surrounding the protrusions to support the substrate upon the protrusions during electrostatic clamping of the substrate. The protrusions are substantially equally spaced across the surface layer as measured by a center to center distance between pairs of neighboring protrusions.

9 Claims, 12 Drawing Sheets

(56) References Cited

U.S. PATENT DOCUMENTS

| | | | |
|---|---|---|---|
| 5,413,360 A | 5/1995 | Atari et al. |
| 5,539,609 A | 7/1996 | Collins et al. |
| 5,557,215 A | 9/1996 | Saeki et al. |
| 5,583,736 A | 12/1996 | Anderson et al. |
| 5,583,737 A | 12/1996 | Collins et al. |
| 5,591,269 A | 1/1997 | Arami et al. |
| 5,625,526 A | 4/1997 | Watanabe et al. |
| 5,656,093 A | 8/1997 | Burkhart et al. |
| 5,691,876 A | 11/1997 | Chen et al. |
| 5,701,228 A | 12/1997 | Ishii |
| 5,740,009 A | 4/1998 | Pu et al. |
| 5,748,434 A | 5/1998 | Rossman et al. |
| 5,761,023 A | 6/1998 | Lue et al. |
| 5,764,471 A | 6/1998 | Burkhart |
| 5,777,838 A | 7/1998 | Tamagawa et al. |
| 5,779,803 A | 7/1998 | Kurono et al. |
| 5,792,562 A | 8/1998 | Collins et al. |
| 5,800,871 A | 9/1998 | Collins et al. |
| 5,825,607 A | 10/1998 | Burkhart |
| 5,851,298 A | 12/1998 | Ishii |
| 5,868,848 A | 2/1999 | Tsukamoto |
| 5,870,271 A | 2/1999 | Herchen |
| 5,880,924 A | 3/1999 | Kumar et al. |
| 5,886,865 A | 3/1999 | Parkhe et al. |
| 5,886,866 A | 3/1999 | Hausmann |
| 5,903,428 A | 5/1999 | Grimard et al. |
| 5,908,334 A | 6/1999 | Chen et al. |
| 5,914,568 A | 6/1999 | Nonaka |
| 5,916,689 A | 6/1999 | Collins et al. |
| 5,923,521 A | 7/1999 | Burkhart |
| 5,946,183 A | 8/1999 | Yamada et al. |
| 5,946,184 A | 8/1999 | Kanno et al. |
| 5,969,934 A | 10/1999 | Larsen |
| 5,997,962 A | 12/1999 | Ogasawara et al. |
| 6,028,762 A | 2/2000 | Kamitani |
| 6,051,122 A | 4/2000 | Flanigan |
| 6,055,150 A | 4/2000 | Clinton et al. |
| 6,072,685 A | 6/2000 | Herchen |
| 6,081,414 A | 6/2000 | Flanigan et al. |
| 6,088,213 A | 7/2000 | Herchen |
| 6,104,595 A | 8/2000 | Brown |
| 6,104,596 A | 8/2000 | Hausmann |
| 6,108,189 A | 8/2000 | Weldon et al. |
| 6,117,246 A | 9/2000 | Parkhe et al. |
| 6,125,025 A | 9/2000 | Howald et al. |
| 6,134,096 A | 10/2000 | Yamada et al. |
| 6,175,485 B1 | 1/2001 | Krishnaraj et al. |
| 6,198,616 B1 | 3/2001 | Dahimene et al. |
| 6,215,640 B1 | 4/2001 | Hausmann |
| 6,217,655 B1 | 4/2001 | Kumar et al. |
| 6,243,251 B1 | 6/2001 | Kanno et al. |
| RE37,294 E | 7/2001 | Knapp et al. |
| 6,259,592 B1 | 7/2001 | Ono |
| 6,304,424 B1 | 10/2001 | Mett et al. |
| 6,338,861 B1 | 1/2002 | Gozu et al. |
| 6,370,004 B1 | 4/2002 | Yamaguchi |
| 6,373,681 B2 | 4/2002 | Kanno et al. |
| 6,414,834 B1 | 7/2002 | Weldon et al. |
| 6,433,346 B1 | 8/2002 | Hirayanagi |
| 6,440,878 B1 | 8/2002 | Yang et al. |
| 6,441,939 B1 | 8/2002 | Bigo et al. |
| 6,452,775 B1 | 9/2002 | Nakajima |
| 6,475,336 B1 | 11/2002 | Hubacek |
| 6,483,690 B1 | 11/2002 | Nakajima et al. |
| 6,490,145 B1 | 12/2002 | Kholodenko et al. |
| 6,522,519 B1 | 2/2003 | Hirayanagi |
| 6,567,257 B2 | 5/2003 | Brown |
| 6,608,745 B2 | 8/2003 | Tsuruta et al. |
| 6,625,003 B2 | 9/2003 | Loo et al. |
| 6,628,503 B2 | 9/2003 | Sogard |
| 6,634,177 B2 | 10/2003 | Lin et al. |
| 6,641,939 B1 | 11/2003 | Lee et al. |
| 6,646,233 B2 | 11/2003 | Kanno et al. |
| 6,678,143 B2 | 1/2004 | Masuda et al. |
| 6,687,113 B2 | 2/2004 | Saito et al. |
| 6,721,162 B2 | 4/2004 | Weldon et al. |
| 6,723,274 B1 | 4/2004 | Divakar |
| 6,754,062 B2 | 6/2004 | Logan et al. |
| 6,785,115 B2 | 8/2004 | Tsuruta et al. |
| 6,790,375 B1 | 9/2004 | Howald et al. |
| 6,813,134 B2 | 11/2004 | Tatsumi et al. |
| 6,835,415 B2 | 12/2004 | Blaedel et al. |
| 6,839,217 B1 | 1/2005 | Larsen |
| 6,853,953 B2 | 2/2005 | Brcka et al. |
| 6,863,281 B2 | 3/2005 | Endou et al. |
| 6,950,297 B2 | 9/2005 | Kosakai |
| 6,982,125 B2 | 1/2006 | LaCourse et al. |
| 7,042,697 B2 | 5/2006 | Tsuruta et al. |
| 7,052,553 B1 | 5/2006 | Shih et al. |
| 7,075,771 B2 | 7/2006 | Brcka |
| 7,078,655 B1 | 7/2006 | Ito et al. |
| 7,088,431 B2 | 8/2006 | Ottens et al. |
| 7,142,405 B2 | 11/2006 | Miyaji et al. |
| 7,175,737 B2 | 2/2007 | Sago et al. |
| 7,187,433 B2 | 3/2007 | Ottens et al. |
| 7,196,896 B2 | 3/2007 | Howald et al. |
| 7,198,276 B2 | 4/2007 | Caldwell et al. |
| 7,209,339 B2 | 4/2007 | Kitabayashi et al. |
| 7,220,319 B2 | 5/2007 | Sago et al. |
| 7,307,697 B2 | 12/2007 | GanapathiSubramanian et al. |
| 7,330,346 B2 | 2/2008 | Ikuhara et al. |
| 7,335,315 B2 | 2/2008 | Matsuda et al. |
| 7,824,498 B2 | 11/2010 | Parkhe et al. |
| 8,861,170 B2 | 10/2014 | Lin et al. |
| 8,879,233 B2 | 11/2014 | Cook et al. |
| 9,025,305 B2 | 5/2015 | Cooke et al. |
| 2001/0003298 A1 | 6/2001 | Shamouilian et al. |
| 2001/0019472 A1 | 9/2001 | Kanno et al. |
| 2001/0055190 A1 | 12/2001 | Saito et al. |
| 2002/0000521 A1 | 1/2002 | Brown |
| 2002/0008954 A1 | 1/2002 | Leeser |
| 2002/0012219 A1 | 1/2002 | Tsuruta et al. |
| 2002/0021545 A1 | 2/2002 | Tatsumi et al. |
| 2002/0027762 A1 | 3/2002 | Yamaguchi |
| 2002/0036373 A1 | 3/2002 | Kosakai |
| 2002/0067585 A1* | 6/2002 | Fujiwara ............... B23Q 3/154 |
| | | 361/234 |
| 2002/0109955 A1 | 8/2002 | Masuda et al. |
| 2002/0130276 A1 | 9/2002 | Sogard |
| 2002/0135969 A1 | 9/2002 | Weldon et al. |
| 2002/0144657 A1 | 10/2002 | Chiang et al. |
| 2002/0144786 A1 | 10/2002 | Chiang et al. |
| 2002/0146511 A1 | 10/2002 | Chiang et al. |
| 2002/0158270 A1 | 10/2002 | Yamamoto et al. |
| 2002/0159217 A1 | 10/2002 | Tsuruta et al. |
| 2002/0167779 A1 | 11/2002 | Carroll et al. |
| 2002/0170882 A1 | 11/2002 | Akiba |
| 2003/0010292 A1 | 1/2003 | Kholodenko et al. |
| 2003/0053282 A1 | 3/2003 | Lee |
| 2003/0053283 A1 | 3/2003 | Loo et al. |
| 2003/0095370 A1 | 5/2003 | Tsuruta et al. |
| 2003/0123213 A1 | 7/2003 | Kosakai |
| 2003/0165043 A1 | 9/2003 | Logan et al. |
| 2003/0168439 A1 | 9/2003 | Kanno et al. |
| 2004/0040665 A1 | 3/2004 | Mizuno et al. |
| 2004/0055709 A1 | 3/2004 | Boyd, Jr. et al. |
| 2004/0070916 A1 | 4/2004 | Tsuruta et al. |
| 2004/0121192 A1 | 6/2004 | LaCourse et al. |
| 2004/0124595 A1 | 7/2004 | Miyaji et al. |
| 2004/0131775 A1 | 7/2004 | Blaedel et al. |
| 2004/0160021 A1 | 8/2004 | Tatsumi et al. |
| 2004/0173469 A1 | 9/2004 | Udo et al. |
| 2004/0190215 A1 | 9/2004 | Weldon et al. |
| 2004/0218339 A1* | 11/2004 | Nakamura ........ H01L 21/67109 |
| | | 361/234 |
| 2004/0233608 A1 | 11/2004 | Brcka |
| 2004/0233609 A1 | 11/2004 | Yoshida et al. |
| 2005/0018377 A1 | 1/2005 | Cho et al. |
| 2005/0029244 A1 | 2/2005 | Ito et al. |
| 2005/0036268 A1 | 2/2005 | Howald et al. |
| 2005/0045106 A1 | 3/2005 | Boyd, Jr. et al. |
| 2005/0069726 A1 | 3/2005 | Douglas et al. |
| 2005/0079737 A1 | 4/2005 | Kellermen et al. |
| 2005/0087939 A1 | 4/2005 | Caldwell et al. |

(56) References Cited

U.S. PATENT DOCUMENTS

| | | | |
|---|---|---|---|
| 2005/0095410 | A1 | 5/2005 | Mazurkiewicz |
| 2005/0106320 | A1 | 5/2005 | Mehregany et al. |
| 2005/0183669 | A1* | 8/2005 | Parkhe ............ H01L 21/6831 118/724 |
| 2005/0247672 | A1 | 11/2005 | Tatsumi |
| 2005/0263077 | A1 | 12/2005 | GanapathiSubramanian et al. |
| 2005/0264134 | A1 | 12/2005 | Ganapathisubramanian et al. |
| 2006/0021705 | A1 | 2/2006 | Imai et al. |
| 2006/0108231 | A1 | 5/2006 | Weichart |
| 2006/0112969 | A1 | 6/2006 | Shih et al. |
| 2006/0121195 | A1 | 6/2006 | Udo et al. |
| 2006/0158823 | A1 | 7/2006 | Mizuno et al. |
| 2007/0047170 | A1 | 3/2007 | Sun et al. |
| 2007/0109713 | A1* | 5/2007 | Miyaji ............ H04N 13/00 361/234 |
| 2007/0109714 | A1 | 5/2007 | Chung |
| 2007/0128570 | A1 | 6/2007 | Goto et al. |
| 2007/0146961 | A1 | 6/2007 | Morioka et al. |
| 2007/0195482 | A1 | 8/2007 | Muka et al. |
| 2007/0217114 | A1 | 9/2007 | Sasaki et al. |
| 2007/0217118 | A1 | 9/2007 | Ikuhara et al. |
| 2007/0222131 | A1 | 9/2007 | Fukumoto et al. |
| 2007/0223173 | A1 | 9/2007 | Fujisawa et al. |
| 2007/0253139 | A1 | 11/2007 | Nakano et al. |
| 2007/0258184 | A1 | 11/2007 | Lee |
| 2007/0258186 | A1 | 11/2007 | Matyushkin et al. |
| 2007/0283891 | A1 | 12/2007 | Okayama |
| 2008/0017104 | A1 | 1/2008 | Matyushkin et al. |
| 2008/0037195 | A1 | 2/2008 | Himori et al. |
| 2008/0037196 | A1 | 2/2008 | Yonekura et al. |
| 2008/0041312 | A1 | 2/2008 | Matsuyama et al. |
| 2008/0062609 | A1 | 3/2008 | Himori et al. |
| 2008/0062610 | A1 | 3/2008 | Himori et al. |
| 2008/0062611 | A1 | 3/2008 | Himori et al. |
| 2008/0062612 | A1 | 3/2008 | Morioka et al. |
| 2008/0066676 | A1 | 3/2008 | Mariner et al. |
| 2008/0073032 | A1 | 3/2008 | Koshiishi et al. |
| 2008/0083700 | A1 | 4/2008 | Bernard et al. |
| 2008/0100983 | A1 | 5/2008 | Purohit et al. |
| 2008/0106842 | A1 | 5/2008 | Ito et al. |
| 2008/0144251 | A1 | 6/2008 | Tao et al. |
| 2008/0239614 | A1 | 10/2008 | Blake et al. |
| 2009/0086401 | A1* | 4/2009 | Samir ............ H01L 21/6831 361/234 |
| 2009/0122458 | A1* | 5/2009 | Lischer ............ H01L 21/6831 361/234 |
| 2009/0242544 | A1 | 10/2009 | Kano |
| 2009/0284894 | A1 | 11/2009 | Cooke |
| 2012/0044609 | A1 | 2/2012 | Cooke et al. |
| 2013/0070384 | A1 | 3/2013 | Cooke et al. |
| 2013/0120897 | A1 | 5/2013 | Lin et al. |
| 2015/0294891 | A1 | 10/2015 | Lin et al. |

FOREIGN PATENT DOCUMENTS

| | | |
|---|---|---|
| EP | 1 119 040 A2 | 7/2001 |
| EP | 1 801 961 A2 | 6/2007 |
| EP | 1801961 A2 | 6/2007 |
| JP | 02-027748 A | 1/1990 |
| JP | 02-304946 A | 12/1990 |
| JP | 5243367 A | 9/1993 |
| JP | 11-214494 A | 8/1999 |
| JP | 2000100917 | 4/2000 |
| JP | 2002-141404 A | 5/2002 |
| JP | 2002-299425 A | 10/2002 |
| JP | 2003-060020 | 2/2003 |
| JP | 2003282688 A | 10/2003 |
| JP | 200422889 | 1/2004 |
| JP | 200533125 A | 2/2005 |
| JP | 2007158185 A | 6/2007 |
| JP | 2007158286 | 6/2007 |
| JP | 2007-194320 A | 8/2007 |
| JP | 2008-066707 | 3/2008 |
| JP | 2008160009 A2 | 10/2008 |
| KR | 10-2005-0064912 A | 6/2005 |
| KR | 10-2006-0081562 A | 7/2006 |
| KR | 100717694 B1 | 5/2007 |
| KR | 10-2007-0066890 A | 6/2007 |
| KR | 10-0755874 B1 | 9/2007 |
| TW | 360937 | 6/1999 |
| WO | WO 99/16122 | 4/1999 |
| WO | WO 99/25006 | 5/1999 |
| WO | WO 99/29001 | 6/1999 |
| WO | WO 99/48148 | 9/1999 |
| WO | WO 99/52144 | 10/1999 |
| WO | WO 99/54928 | 10/1999 |
| WO | WO 99/57753 | 11/1999 |
| WO | WO 99/60613 | 11/1999 |
| WO | WO 99/62115 | 12/1999 |
| WO | WO 00/19519 | 4/2000 |
| WO | WO 00/19592 | 4/2000 |
| WO | WO 00/35003 | 6/2000 |
| WO | WO 01/42163 A2 | 6/2001 |
| WO | WO 02/31219 A1 | 4/2002 |
| WO | WO 03/003449 A2 | 1/2003 |
| WO | WO 03/008666 A1 | 1/2003 |
| WO | WO 2004/027839 A2 | 4/2004 |
| WO | WO 2004/059701 A2 | 7/2004 |
| WO | WO 2004/059714 A1 | 7/2004 |
| WO | WO 2004/107387 A2 | 12/2004 |
| WO | WO 2005/119802 A2 | 12/2005 |
| WO | WO 2006/060234 A2 | 6/2006 |
| WO | WO 2007/043519 A1 | 4/2007 |
| WO | WO 2007/064435 A2 | 6/2007 |
| WO | WO 2007/100571 A2 | 9/2007 |
| WO | WO 2008/088471 A1 | 7/2008 |
| WO | WO 2008/118683 A1 | 10/2008 |
| WO | WO 2009/013803 A1 | 1/2009 |
| WO | WO 2009/142710 A1 | 11/2009 |
| WO | WO 2010/132640 A2 | 11/2010 |
| WO | WO 2011/149918 A2 | 12/2011 |
| WO | WO 2012/033922 | 3/2012 |

OTHER PUBLICATIONS

International Preliminary Report on Patentability from counterpart International Application No. PCT/US2009/003015, dated Dec. 2, 2010.
International Search Report from counterpart International Application No. PCT/US2009/003015, dated Jul. 16, 2009.
Written Opinion of the International Searching Authority from counterpart International Application No. PCT/US2009/003015, dated Jul. 16, 2009.
Notification of Transmittal of the International Search Report and Written Opinion of the International Searching Authority from counterpart International Application No. PCT/US2010/034667, dated Feb. 1, 2011.
International Preliminary Report on Patentability for PCT/US2010/034667, dated Nov. 24, 2011 (4 pgs.).
Notification of Transmittal of the International Search Report and Written Opinion of the International Searching Authority from counterpart International Application No. PCT/US2011/037712, "High Surface Resistivity Electrostatic Chuck," dated Jan. 10, 2012.
International Preliminary Report on Patentability from counterpart International Application No. PCT/US2011/037712, "High Surface Resistivity Electrostatic Chuck," dated Sep. 18, 2012.
Supplementary European Search Report, EP10775520, dated Oct. 18, 2013.
Non-Final Office Action for U.S. Appl. No. 13/266,657; dated Nov. 8, 2013 "Electrostatic Chuck With Polymer Protrusions".
Non-Final Office Action for U.S. Appl. No. 13/699,279, "High Surface Resistivity Electrostatic Chuck"; dated Mar. 12, 2014.
Search Report for Taiwan Application No. 098115989 "Electrostatic Chuck"; Date of Completion: Feb. 17, 2014 (2 pp.).
Notification of Transmittal of the International Search Report and Written Opinion of the International Searching Authority from counterpart International Application No. PCT/US2013/067301 "Electrostatic Chuck with Photo-Patternable Soft Protrusion Contact Surface"; dated Jan. 16, 2014 (10 pp.).

(56) References Cited

OTHER PUBLICATIONS

Notice of Allowance for U.S. Appl. No. 13/266,657, "Electrostatic Chuck with Polymer Protrusions", dated Apr. 10, 2014.
Notice of Allowance for U.S. Appl. No. 13/266,657, "Electrostatic Chuck with Polymer Protrusions", dated Jul., 18, 2014.
Notice of Allowance for U.S. Appl. No. 13/667,516, "Electrostatic Chuck with Photo-Patternable Soft Protrusion Contact Surface", dated Jun. 13, 2014.
Final Office Action, U.S. Appl. No. 13/699,279, dated Aug. 11, 2014 "Electrostatic Chuck With Polymer Protrusions".
Second Written Opinion for International Application No. PCT/US2013/067301, entitled: "Electrostatic Chuck with Photo-Patternable Soft Protrusion Contact Surface", dated Oct. 16, 2014.
Notice of Allowance for U.S. Appl. No. 13/699,279, entitle "High Surface Resistivity Electrostatis Chuck", dated Dec. 31, 2014.
Notification of Transmittal of the International Preliminary Report on Patentability for International Application No. PCT/US2013/067301, Electrostatic Chuck With Photo-Patternable Soft Protrusion Contact Surface, dated Apr. 2, 2015.

\* cited by examiner

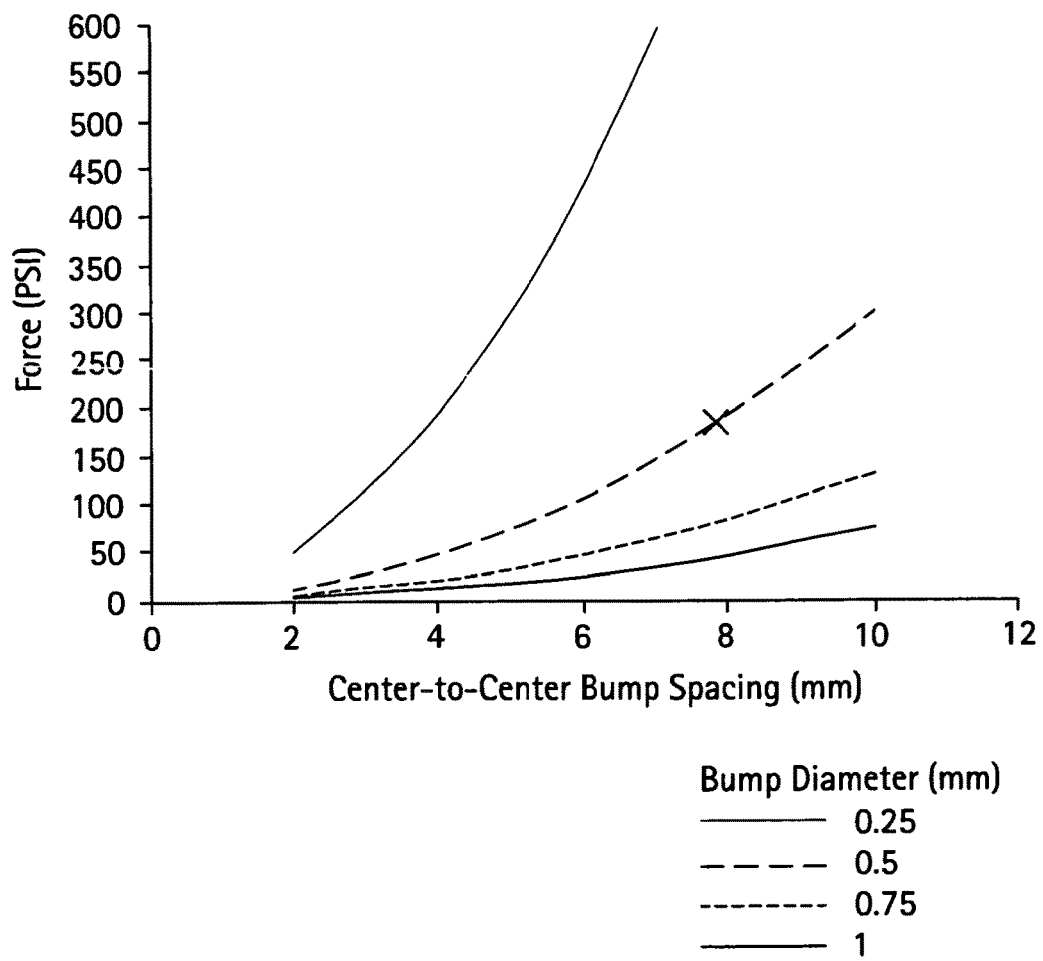

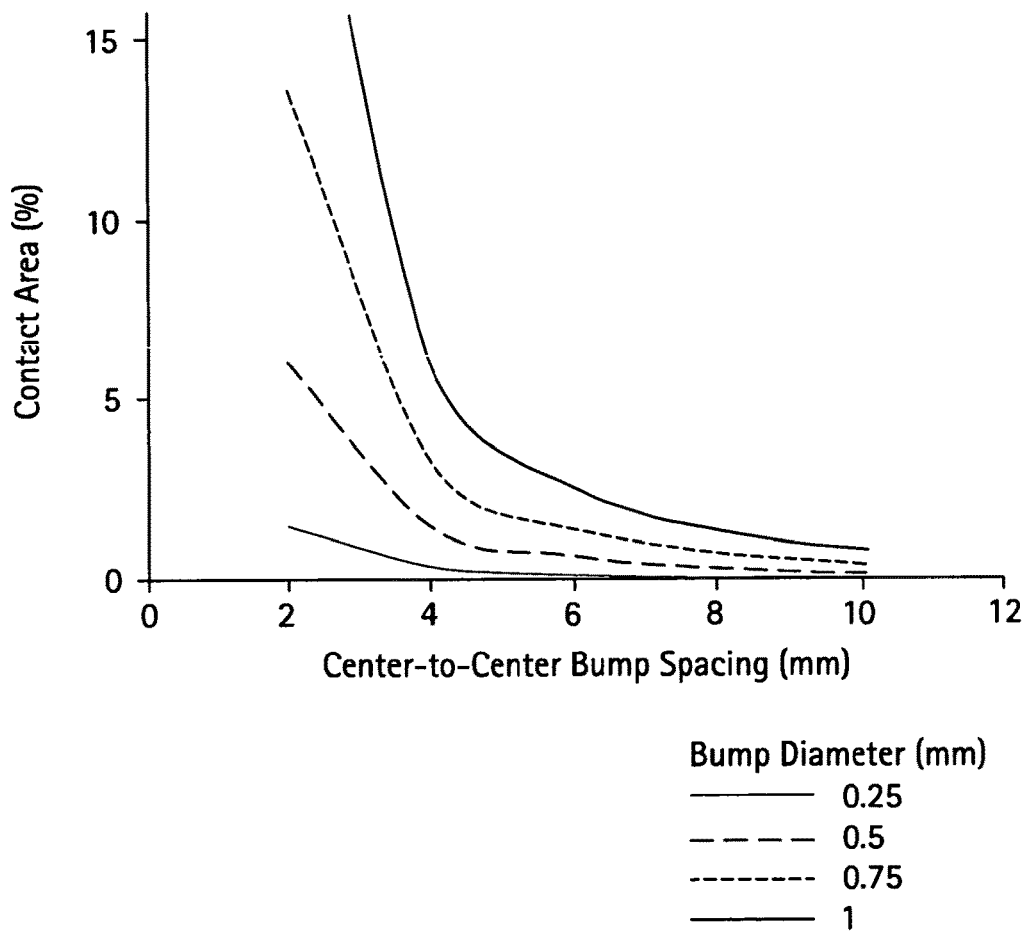

FIG. 8
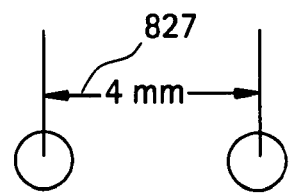

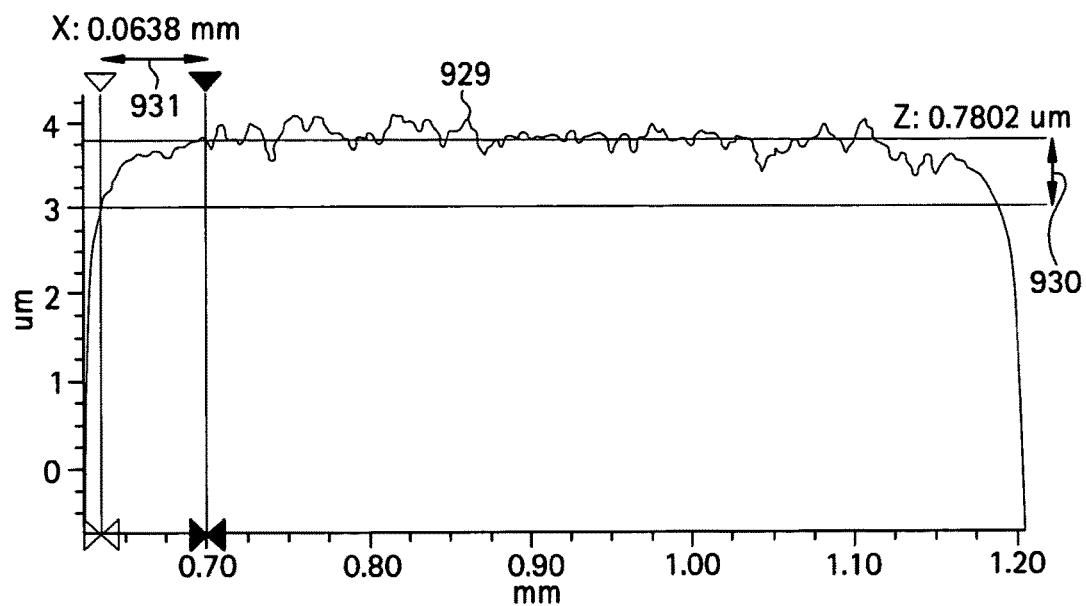
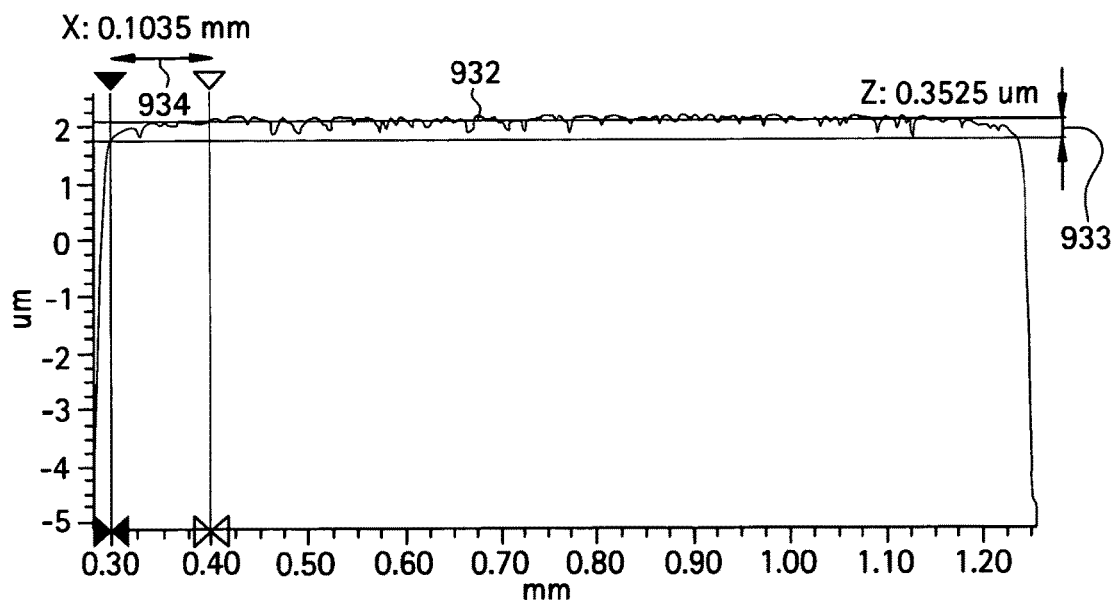

ELECTROSTATIC CHUCK

RELATED APPLICATIONS

This application is a continuation of U.S. application Ser. No. 12/454,336, filed May 15, 2009, which claims the benefit of U.S. Provisional Application No. 61/054,259, filed May 19, 2008, and claims the benefit of U.S. Provisional Application No. 61/094,700, filed Sep. 5, 2008. The entire teachings of the above applications are incorporated herein by reference.

BACKGROUND

An electrostatic chuck holds and supports a substrate during a manufacturing process and also removes heat from the substrate without mechanically clamping the substrate. During use of an electrostatic chuck, the back side of a substrate, such as a semiconductor wafer, is held to the face of the electrostatic chuck by an electrostatic force. The substrate is separated from one or more electrodes in the face of the electrostatic chuck by a surface layer of material that covers the electrode. In a Coulombic chuck, the surface layer is electrically insulating, while in a Johnsen-Rahbek electrostatic chuck, the surface layer is weakly conducting. The surface layer of the electrostatic chuck may be flat or may have one or more protrusions, projections or other surface features that further separate the back side of the substrate from the covered electrode. Heat delivered to the substrate during processing can be transferred away from the substrate and to the electrostatic chuck by contact heat conduction with the protrusions and/or by gas heat conduction with a cooling gas. Contact heat conduction is generally more efficient than gas heat conduction in removing heat from the substrate. However, controlling the amount of contact between the substrate and the protrusions can be difficult.

In microelectronics production, as semiconductor and memory device geometries become progressively smaller and the sizes of wafers, flat screen displays, reticles and other processed substrates become progressively larger, the allowable particulate contamination process specifications become more restrictive. The effect of particles on electrostatic chucks is of particular concern because the wafers physically contact or mount to the chuck clamping surface. If the mounting surface of the electrostatic chuck allows any particulate to become entrapped between the mounting surface and the substrate, the substrate may be deformed by the entrapped particle. For example, if the back side of a wafer is clamped electrostatically against a flat reference surface, the entrapped particle could cause a deformation of the front side of the wafer, which will therefore not lie in a flat plane. According to U.S. Pat. No. 6,835,415, studies have shown that a 10-micron particle on a flat electrostatic chuck can displace the surface of a reticle (i.e., a test wafer) for a radial distance of one inch or more. The actual height and diameter of the particle-induced displacement is dependent on numerous parameters such as the particle size, the particle hardness, the clamping force and the reticle thickness.

During substrate processing it is important to be able to control the temperature of the substrate, limit the maximum temperature rise of the substrate, maintain temperature uniformity over the substrate surface, or any combination of these. If there are excessive temperature variations across the substrate surface due to poor and/or non-uniform heat transfer, the substrate can become distorted and process chemistry can be affected. The greater the area of direct contact with the electrostatic chuck, the greater the heat transferred by contact heat conduction. The size of the area of direct contact is a function of the roughness, flatness and hardness of the contact surfaces of the substrate and electrostatic chuck, as well as of the applied pressure between the contact surfaces. Since the characteristics of the contact surface vary from substrate to substrate, and since the characteristics of the contact surface can change over time, accurately controlling contact heat conductance between the electrostatic chuck and substrate is difficult.

Controlling the temperature of a substrate and the number of particles on its back side is important for reducing or eliminating damage to microelectronic devices, reticle masks and other such structures, and for reducing or minimizing manufacturing yield loss. The abrasive properties of the electrostatic chuck protrusions, the high contact area of roughened protrusions, and the effect of lapping and polishing operations during manufacture of electrostatic chucks may all contribute adder particles to the back side of substrates during use with an electrostatic chuck.

SUMMARY OF THE INVENTION

In accordance with an embodiment of the invention, there is provided an electrostatic chuck comprising an electrode, and a surface layer activated by a voltage in the electrode to form an electric charge to electrostatically clamp a substrate to the electrostatic chuck. The surface layer includes a plurality of protrusions extending to a height above portions of the surface layer surrounding the protrusions to support the substrate upon the protrusions during electrostatic clamping of the substrate. The protrusions are substantially equally spaced across the surface layer as measured by a center to center distance between pairs of neighboring protrusions.

In further, related embodiments, the protrusions may be arranged in a trigonal pattern. At least one of the height and a contact area and roughness of the protrusions may be such that at least one of the temperature and the temperature distribution of the substrate, when the substrate is heated during the electrostatic clamping, is substantially controlled by gas heat conduction of a gas in a space between the substrate, the protrusions, and the portions of the surface layer surrounding the protrusions. Greater than about 25%, or greater than about 50%, or greater than about 75%, of a top area of each of the protrusions may contact the substrate during the electrostatic clamping. Less than about 5000 particle adders, or less than about 3000 particle adders, or less than about 2500 particle adders, or less than about 1500 particle adders, may be deposited on a back side of the substrate as a result of a use of the electrostatic chuck that includes at least one of: the electrostatic clamping of the substrate, de-clamping the substrate from the electrostatic clamping, and performing the electrostatic clamping during a manufacturing process performed on the substrate.

In other related embodiments, the protrusions may be formed from at least one low stress material, which may comprise at least one of an amorphous dielectric material and a polycrystalline dielectric material. The protrusions may comprise a dielectric material having a resistivity greater than about 1012 ohm-cm. The dielectric material may included at least one of silicon, an alloy of silicon with at least one other element, silicon carbide and non-stoichiometric silicon carbide. Further, the protrusions may comprise a dielectric material including at least one of alumina and aluminum nitride. The protrusions may comprise a dielectric material such that a Johnsen-Rahbek force or partial hybrid Johnsen-Rahbek force does not act on the substrate during the electrostatic clamping. Also, the protrusions may comprise a compliant dielectric material; and may comprise a dielectric material having a resistivity such that the substrate is retained upon the electrostatic chuck via the Johnsen-Rahbek effect during the electrostatic clamping.

In further, related embodiments, a contact area of the protrusions with the substrate may comprise from about 1% to about 10% of a total area of the electrostatic chuck. The protrusions may have a diameter of from about 0.75 millimeters to about 1 millimeter. The center to center distance between pairs of neighboring protrusions may be less than about 8 millimeters, or less than about 6 millimeters, or less than about 4 millimeters, or less than about 2 millimeters. The protrusions may comprise at least one partial protrusion, the partial protrusion comprising at least part of a surface structure of the electrostatic chuck, which may be selected from at least one of a gas channel, a lift pin and a ground pin. The height of the protrusions may be substantially equal to the mean free path of a gas located during the electrostatic clamping in a space between the substrate, the protrusions, and the portions of the surface layer surrounding the protrusions.

In other related embodiments, the protrusions may include a top surface having a surface roughness metric reduced, by virtue of at least some machine polishing, by between about 25% and about 75%, or by about 50%, by comparison with similar protrusions polished only by hand. The protrusions may include modified edge geometry produced by at least some machine polishing, such that a characteristic rounding height of a protrusion is shorter by comparison with a corresponding height of a similar protrusion polished only by hand and such that a characteristic rounding length is longer by comparison with a corresponding length of a similar protrusion polished only by hand. The ratio of the characteristic rounding height to the characteristic rounding length may be reduced by a factor of between about 2 and about 5, or between about 3 and about 4, by comparison with the similar protrusion polished only by hand. Less than about 5000 particle adders, or less than about 2000 particle adders, of particle size range of 0.16 μm or greater may be deposited on the back side of the substrate as a result of the use of the electrostatic chuck. Further, the protrusions may include modified edge geometry such that a ratio of a characteristic rounding height of a protrusion to a characteristic rounding length is between about 0.00407 and about 0.00306, or between about 0.00611 and about 0.002444.

In a further embodiment according to the invention, the surface layer of the electrostatic chuck may comprise a charge control surface layer. The charge control surface layer may have a surface resistivity in the range of from about 1×108 ohms/square to about 1×1011 ohms/square; and may comprise a silicon carbide composition. The surface resistivity of the charge control surface layer may be controlled by varying the amount of silicon precursor gas and carbon precursor gas used to make the silicon carbide composition. The silicon carbide composition may comprise silicon carbide or non-stoichiometric silicon carbide. The charge control surface layer may comprise at least one protrusion and a surface coating layer. The charge control surface layer may be formed by blanket depositing a silicon carbide composition layer on a dielectric; patterning the silicon carbide composition layer using photolithography; and removing portions of the silicon carbide composition layer using reactive ion etching to leave at least one silicon carbide composition protrusion. The charge control surface layer may also be formed by patterning a dielectric layer using bead blasting or etching; and conformally coating the dielectric layer with the charge control surface layer. The charge control surface layer may comprise at least one material selected from the group consisting of diamond-like carbon, amorphous silicon, metal-doped oxide and combinations of these.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 6 is a graph of calculated force between a wafer and electrostatic chuck protrusions for various protrusion diameters and center to center bump spacing, in accordance with an embodiment of the invention.

FIG. 7 is a graph of calculated contact area for different protrusion diameters and center to center protrusion spacings, in accordance with an embodiment of the invention.

FIG. 8 is a diagram of protrusions on an electrostatic chuck featuring a 4 millimeter center to center spacing and a diameter of 0.75 millimeters, in accordance with an embodiment of the invention.

FIGS. 9A and 9B are graphs of a cross-sectional profile of a protrusion on an electrostatic chuck with and without (FIGS. 9A and 9B respectively) an added stage of pad polishing, in accordance with an embodiment of the invention.

DETAILED DESCRIPTION OF THE INVENTION

Figure 1:
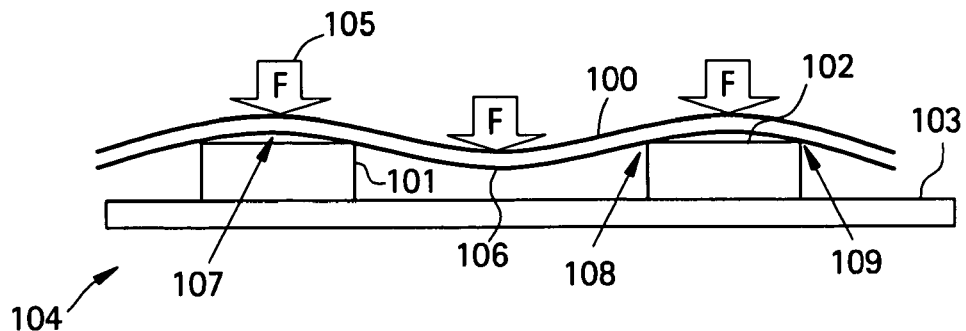
FIG. 1 is a cross-sectional side view of a substrate bowing between protrusions on the surface of an electrostatic chuck, in accordance with the prior art.

A description of example embodiments of the invention follows.

The inventors have recognized that the uneven loading of force between a substrate and protrusions of an electrostatic chuck during electrostatic chucking is a source of particles that can be deposited on the back side of the substrate as a result of use or during use of the chuck. Uneven loading of the substrate on the protrusions during chucking can also lead to inconsistent contact heat conductance between the substrate and electrostatic chuck. The uneven loading of the force between the substrate and protrusions can result when the substrate lifts near the center of the protrusion and/or bows between the protrusions, which can result in the force between the substrate and the electrostatic chuck being distributed over the outer edge regions of the protrusions rather than across their surfaces. In some cases the uneven loading results in less than the full area of the protrusion contacting the substrate, which can result in a high concentration of force on a smaller area of the protrusions.

The uneven loading of the force between the substrate and the protrusions as a result of use or during use of an electrostatic chuck can result in particles that correlate with the protrusions. In accordance with an embodiment of the invention, these particles can be reduced or eliminated by distributing the force between the electrostatic chuck and substrate across the area of the protrusions and by a substantially equal spacing of the protrusions across the surface of the chuck. In an electrostatic chuck according to an embodiment of the invention, the protrusions can have a height, contact area, and roughness such that gas heat conduction controls the substrate temperature and the temperature distribution of the substrate. In accordance with an embodiment of the invention, greater than 25% of the area of each protrusion may contact the substrate during chucking. Further, the number of particles on the back side of the substrate from the uneven loading between the substrate and the protrusions may be less than 5,000 adders, and in some case less than 3,000 adders, and in further cases less than 2,500 adders, and in still other cases less than 1,500 adders. Lower numbers of particles indicate more uniform distribution of substrate loading, less wafer lift at the center of the protrusion, less wafer bowing between protrusions, and lower contact forces between protrusions and the substrate, which results in fewer particles correlated with the protrusions. The lower the number of such particles, the lower the number of manufacturing defects, the better the gas seal for the electrostatic chuck, and the higher the manufacturing yield.

In accordance with an embodiment of the invention, an electrostatic chuck is provided with a surface having substantially equally spaced protrusions across the surface of the electrostatic chuck that contact the back side of the chucked substrate. The spacing, height, and contact area of the protrusions are so arranged as to provide an acceptable temperature and temperature uniformity during a process that treats the substrate. The arrangement of protrusions provides a force between the substrate and the electrostatic chuck that holds the substrate and distributes the force across the protrusions so that, for example, fewer than 3,000 particles correlated with the protrusions are added to the back side of the substrate from the force or contact. The protrusions are made from a low stress material that reduces the number of particles caused by stress cracks or fractures, and can reduce gas leaks through the electrostatic chuck gas seals. The arrangement of the electrostatic chuck protrusions may reduce or eliminate the uneven loading of the substrate against the protrusions, and may reduce particles, provide better temperature control and uniformity across the substrate, or any combination including these.

In accordance with an embodiment of the invention, an electrostatic chuck provides more uniform loading of the substrate with the protrusions, by featuring a plurality of protrusions formed across the face of the electrostatic chuck, the protrusions or a portion of them being equally spaced across the surface of the electrostatic chuck. For example, the protrusions may be arranged in a pattern such as a trigonal pattern. The contact area of the protrusions may range from greater than 1% to less than about 10% of the electrostatic chuck area. The protrusions may be arranged to have a diameter of from 0.75 millimeters to 1 millimeter, and may be substantially equally spaced apart by a distance of less than 8 millimeters. A wafer held by such an electrostatic chuck may be retained substantially without bowing in the regions between the protrusions and without lifting in the center of the protrusions, thereby avoiding the production of undesirable particles. An embodiment according to the invention reduces or eliminates particles on the back side of the substrate that correlate with the protrusions, and provides a substantially uniform temperature and temperature range or distribution across the substrate.

In accordance with an embodiment of the invention, particles added to the back side of a substrate as a result of the uneven loading of force between the substrate and the surface of an electrostatic chuck can be reduced or eliminated by an equally spacing, or substantially equally spacing, protrusions across the surface of the electrostatic chuck for contacting the back side of the substrate. The spacing and contact area of the protrusions on the electrostatic chuck are so arranged as to provide acceptable heat removal from the substrate during a manufacturing process. Further, the spacing and contact area of the protrusions provide a force between the substrate and the electrostatic chuck that holds the wafer without causing substrate bowing between the protrusions, and that distributes the load across the protrusions, thereby reducing the number of particles correlated with the protrusions on the back side of the substrate.

FIG. 1 is a cross-sectional side view of a substrate 100 bowing between protrusions 101, 102 on the surface 103 of an electrostatic chuck 104, in accordance with the prior art. Under the pressure of electrostatic force 105, the substrate 100 bows downwards in regions 106 between the protrusions 101, 102, and lifts in the center regions 107 of the protrusions 101, 102. (The extent of bowing and lifting is exaggerated in FIG. 1 for purposes of illustration). As a result of the bowing and lifting of the substrate 100, high contact forces can be generated between the substrate 100 and the edges 108, 109 of the protrusions, which can create local areas of stress and create undesirable particles, the location of which may correlate with the locations and/or features of the protrusions 101, 102 on the electrostatic chuck. As illustrated in FIG. 1, during chucking, bowing of the substrate 100 between protrusions 101, 102 and possible lifting of the substrate at the center 107 of the protrusions 101, 102 can lead to uneven loading on the protrusions 101, 102 and particles on the back side of the substrate.

By contrast, in accordance with an embodiment of the invention, equally spaced protrusions that contact the back side of the electrostatically chucked substrate may reduce particulate contamination that correlates with the protrusions on the substrate back side, may produce uniform temperature across the substrate, and may produce a strong chucking force. The area of any protrusion in contact with the back side of the substrate can be chosen to reduce or eliminate substrate lift at one or more of the protrusions, reduce or eliminate substrate bowing between protrusions, provide a more even loading of substrate force on the protrusions, and reduce particles that correlate with the protrusions due to uneven substrate protrusion loading. In one embodiment according to the invention, greater than 25% of the area of each protrusion contacts the substrate during chucking; in another embodiment, greater than 50% of the area of each protrusion contacts the substrate during chucking; and in a further embodiment of the invention, greater than 75% of the area of each protrusion contacts the substrate during chucking. The amount of protrusion contact area can be determined by the flatness of the substrate during a process, by a decrease in substrate back side particles correlated with the protrusions, or by a marking between a test substrate and a transferable marking material on the protrusions. In one embodiment, protrusions are substantially cylindrical and have a diameter on the top surface that can be in the range of from greater than 0.5 millimeters to less than 1.5 millimeters. Other shaped protrusions with an area similar to these can also be used.

In accordance with an embodiment of the invention, the protrusions or portions of them are spaced equally or substantially equally apart across the electrostatic chuck surface and are above the electrode in a dielectric layer. The spacing between protrusions can be measured from the center of the top of one protrusion to the center of the tops of adjacent protrusions. The spacing can be in a regular pattern. For example, in one embodiment, the spacing of protrusions is in a trigonal pattern that reduces the force per unit area with the chucked wafer or other substrate by 20-30 percent compared to a square pattern of protrusions. In accordance with an embodiment of the invention, a protrusion near a gas channel, lift pin, ground pin or other surface structure may differ from other protrusions by having a portion of the protrusion formed as the surface structure and another portion extending out from the surface structure as a partial protrusion. Alternatively, such a protrusion may have a smaller or larger size or a different shape than other protrusions on the surface of the electrostatic chuck. For example, a cylindrically shaped protrusion near a gas seal may have a portion of the cylinder formed as the gas seal and another portion extending out from the gas seal. In addition, the location and size of the gas channels, lift pins, ground pins and other surface structures may be modified to provide uniform protrusion spacing; and protrusions near such surface structures may be spaced from them such that the spacing from a protrusion to a surface structure is the same as or smaller than the spacing from protrusion to protrusion. In one embodiment, the protrusion spacing may be less than 8 millimeters center to center; in another embodiment the protrusion spacing may be about 6 millimeters or less center to center; in another embodiment the protrusion spacing is about 4 millimeters or less center to center; and in another embodiment the protrusion spacing is about 2 millimeters or less center to center, especially for small diameter protrusions of about 0.5 millimeters of less or equivalents thereof.

Generally, the amount of contact area between the protrusions and the substrate affects the amount of contact heat conduction from the substrate to the protrusions, and also affects the amount of bowing and lifting of the substrate during chucking. In accordance with an embodiment of the invention, the contact area of the protrusions with the substrate, based on the geometric area of the protrusions and not including gas seals, can be in the range from greater than 1% to less than about 10% of the area of the electrostatic chuck's surface. Since gas heat conduction with a cooling gas is easier to control than contact heat conduction, another embodiment of the invention has such a contact area in the range of from greater than 1% to about 4%; and a further embodiment of the invention has such a contact area in the range of from about 2% to about 4%.

According to U.S. Pat. No. 6,117,246, one disadvantage of using an electrostatic chuck body fabricated from a ceramic, which is a dielectric, is that during manufacture of the support, the ceramic material is "lapped" to produce a relatively smooth surface. According to U.S. Pat. No. 6,117,246, such lapping produces particles that adhere to the surface of the support, and that are very difficult to completely remove from the surface. Further, the lapping process may fracture the surface of the chuck body. Consequently, as the chuck is used, particles are continuously produced by these fractures. Also according to U.S. Pat. No. 6,117,246, during wafer processing, the ceramic material can abrade the wafer oxide from the underside of the wafer, resulting in further introduction of particulate contaminants to the process environment. During use of the chuck or as a result of use of the chuck, the particles can adhere to the underside of the wafer and can be carried to other process chambers or cause defects in the circuitry fabricated upon the wafer. According to U.S. Pat. No. 6,117,246, tens of thousands of contaminant particles may be found on the back side of a given wafer after retention upon a ceramic electrostatic chuck.

By contrast, in accordance with an embodiment of the invention, protrusions are formed on an electrostatic chuck by processes that result in low stress materials, which resist cracking and resist changes in dimension, thereby minimizing particle sources and providing more uniform loading of the substrate on the area of the protrusions. For example, protrusions may be formed of amorphous films made by Plasma Enhanced Chemical Vapor Deposition (PECVD). The protrusions may be formed of a dielectric material, such as an amorphous dielectric material or a polycrystalline dielectric material. The dielectric material may be patterned by a process that provides a low stress material, such as a reactive ion etching process, a chemical etching process, or a bead blasting process. Stress may be measured in the dielectric by films deposited on a wafer and then characterized by wafer bowing, X-ray diffraction or Raman Spectroscopy.

In accordance with an embodiment of the invention, the electrostatic chuck is a Coulombic chuck, and the dielectric for the Coulombic chuck may have a resistivity greater than about $10^{12}$ ohm-cm. The dielectric may be silicon or an alloy of silicon with other elements, for example silicon carbide or non-stoichiometric silicon carbide compositions. The dielectric can include aluminum, for example alumina or aluminum nitride. In a further embodiment according to the invention, the electrostatic chuck is a Johnsen-Rahbek electrostatic chuck. Alternatively, the electrostatic chuck may not be a Johnsen-Rahbek electrostatic chuck, and the dielectric may be chosen so that a Johnsen-Rahbek (JR) force or partial hybrid Johnsen-Rahbek force does not act on the wafer or substrate. One or more protrusions may include a compliant dielectric material, such as any of the suitable compliant materials disclosed in U.S. Pat. No. 6,835,415, the disclosure of which is hereby incorporated herein by reference in its entirety. In one embodiment according to the invention, the dielectric for the protrusions is made from a silicon carbide film having a resistivity of about 108 ohm-cm, or about 1010 ohm/sq, an internal compressive film stress in a range of less than about 450 MPa, and more preferably less than about 450 MPa (as deposited). The layer of silicon carbide preferably is deposited to a thickness in a range of about 2-10 microns.

In another embodiment according to the invention, the dielectric for the protrusions is made from a charge control surface layer material having a resistivity of from about 108 ohm/sq to about 1011 ohm/sq, an internal compressive film stress of less than about 450 MPa, and more preferably less than about 450 MPa (as deposited). The charge control layer may be deposited to a thickness in a range of from about 0.1 to about 10 microns thick, or preferably from about 1 to about 3 microns thick. In addition, the dielectric for the protrusions may be formed with a low stress material (such as one with an internal compressive film stress in a range of less than about 450 MPa), and then overcoated with a thin coating of diamond-like carbon (or other material that typically has a higher compressive film stress) to achieve the desired surface resistivity.

In another embodiment according to the invention, the dielectric may be a ceramic or polymeric material having a controlled resistivity within a range of about 107-1012 ohm-cm, which allows a wafer or other workpiece to be supported and retained upon the electrostatic chuck via the Johnsen-Rahbek effect.

In order to characterize an electrostatic chuck according to an embodiment of the invention, and to compare such electrostatic chucks with each other, there may be used a technique of correlating particle production with protrusion locations. In general, during use of an electrostatic chuck, undesirable particles can accumulate on the protrusion and channel surfaces of the electrostatic chuck and/or the back side surface of the substrate. Such undesirable particles are referred to herein as "adders" or "particle adders." Particles can be measured and compared before and after use of the electrostatic chuck in processing or chucking/dechucking. A correlation technique may include analyzing the correlation between the locations of protrusions on the electrostatic chuck and the locations where particles have been produced on the back side of the substrate. Based on the degree of correlation between the protrusion locations and the particle locations, it can be determined how evenly loaded is the electrostatic force between the substrate and the protrusions. An uneven loading of the electrostatic force generally produces a closer correlation between the protrusion locations and the particle locations, while a more even loading produces a lack of correlation. The correlation technique may include correlating the location of the protrusions, or of features of the protrusions, with: the location of particles; the number and size of particles; the distribution of particle sizes; the particle composition, or any combination of these. Particles that correlate with the protrusions can be detected by laser surface scanning of the substrate and the electrostatic chuck, and determination of the number, size, and distribution of the particles added after processing or chucking/dechucking. Repeated processing (etching, ion implantation, and the like), repeated chucking and dechucking of the substrate (for example, performing one million chuck/release cycles), pop off testing, and other simulated processing acts can be used to evaluate the number of particle adders for an electrostatic chuck.

In accordance with an embodiment of the invention, the number of particles on the back side of a substrate that correlate with electrostatic chuck protrusions, the particles having been produced by uneven loading of force between the substrate and the protrusions, may be less than 5000, in some cases less than 3,000, in further cases less than 2,500, and in still other cases less than 1,500 for a 300 millimeter diameter wafer after clamping in vacuum for 60 seconds without cooling gas. For substrates having larger or smaller surface areas, for example 450 mm or 200 mm wafers, the number of particle adders can be scaled according to the substrate area. Lower numbers of particles indicate a more uniform loading of forces between the substrate and protrusions. A more uniform loading of force produces less substrate lift at the center of the protrusion, less substrate bowing between protrusions, lower contact forces between protrusion edges and the substrate, and more consistent heat transfer. The lower the number of back side particles on the substrate that correlate with the protrusions, the lower the number of manufacturing defects and the higher the manufacturing yield.

In one embodiment according to the invention, there is a reduced total back side loading of particles that correlate with protrusions as a result of the uneven loading of force, per wafer clamp between an electrostatically chucked wafer or substrate and electrostatic chuck surface protrusions. The size and distribution of the back side particles may, for example, be as follows: for 0.12 to 0.16 micron particle size, less than 800 adders; for 0.16 to 0.2 micron particle size, less than 500 adders; for 0.2 to 0.3 micron particle size, less than 500 adders; for 0.300 to 0.5 micron particle size, less than 500 adders; for 0.5 to 1.0 micron particle size, less than 175 adders; for 1 to 2 micron particle size, less than 100 adders; for 2 to 5 micron particle size, less than 50 adders; for 5 to 10 micron particle size, less than 20 adders; or a total of less than 2645 adder particles across these particle size ranges that correlate with the protrusions for a 300 millimeter diameter wafer after clamping in vacuum for 60 seconds without cooling gas. In accordance with an embodiment of the invention, the total number of adder particles may be less than the total sum of one or more of these size ranges. For example, for particles between 0.5 and 10 microns, an embodiment may have the following distribution of particles: for 0.5 to 1.0 micron particle size, less than 175 adders; for 1 to 2 micron particle size, less than 100 adders; for 2 to 5 micron particle size, less than 50 adders; for 5 to 10 micron particle size, less than 20 adders; or a total of less than 345 adder particles across these particle size ranges that correlate with the protrusions for a 300 millimeter diameter wafer after clamping in vacuum for 60 seconds without cooling gas.

In another example, the distribution may be as follows: for 0.12 to 0.16 micron particle size, less than 600 adders; for 0.16 to 0.2 micron particle size, less than 275 adders; for 0.2 to 0.3 micron size, less than 325 adders; for 0.300 to 0.5 micron particle size, less than 450 adders; for 0.5 to 1.0 micron, particle size less than 300 adders; for 1 to 2 micron particle size, less than 120 adders; for 2 to 5 micron particle size, less than 30 adders; for 5 to 10 micron particle size, less than 10 adders; or a total of less than 2110 adders across these particle size ranges for a 300 millimeter diameter wafer after clamping in vacuum for 60 seconds without cooling gas. In accordance with an embodiment of the invention, the total number of adder particles may be less than the total sum of one or more of these size ranges. For example, for particles between 0.3 and 10 microns, an embodiment may have the following distribution of particles: for 0.300 to 0.5 micron particle size, less than 450 adders; for 0.5 to 1.0 micron particle size, less than 300 adders; for 1 to 2 micron particle size, less than 120 adders;

for 2 to 5 micron particle size, less than 30 adders; for 5 to 10 micron particle size, less than 10 adders; or a total of less than 910 adder particles across these particle size ranges that correlate with the protrusions for a 300 millimeter diameter wafer after clamping in vacuum for 60 seconds without cooling gas. Other sizes and distributions of back side particles may be obtained; for example, less than about 5000 adder particles of a diameter greater than 0.16 microns may be obtained; or less than about 5000 adder particles of a diameter greater than 0.12 microns may be obtained.

In a further embodiment according to the invention, the surface layer of the electrostatic chuck may comprise a charge control surface layer. The charge control surface layer may have a surface resistivity in the range of from about $1 \times 10^8$ ohms/square to about $1 \times 10^{11}$ ohms/square; and may comprise a silicon carbide composition. The surface resistivity of the charge control surface layer may be controlled by varying the amount of silicon precursor gas and carbon precursor gas used to make the silicon carbide composition. The silicon carbide composition may comprise silicon carbide or non-stoichiometric silicon carbide. The charge control surface layer may comprise at least one protrusion and a surface coating layer. The charge control surface layer may be formed by blanket depositing a silicon carbide composition layer on a dielectric; patterning the silicon carbide composition layer using photolithography; and removing portions of the silicon carbide composition layer using reactive ion etching to leave at least one silicon carbide composition protrusion. The charge control surface layer may also be formed by patterning a dielectric layer using bead blasting or etching; and conformally coating the dielectric layer with the charge control surface layer. The charge control surface layer may comprise at least one material selected from the group consisting of diamond-like carbon, amorphous silicon, metal-doped oxide and combinations of these.

Figure 2:
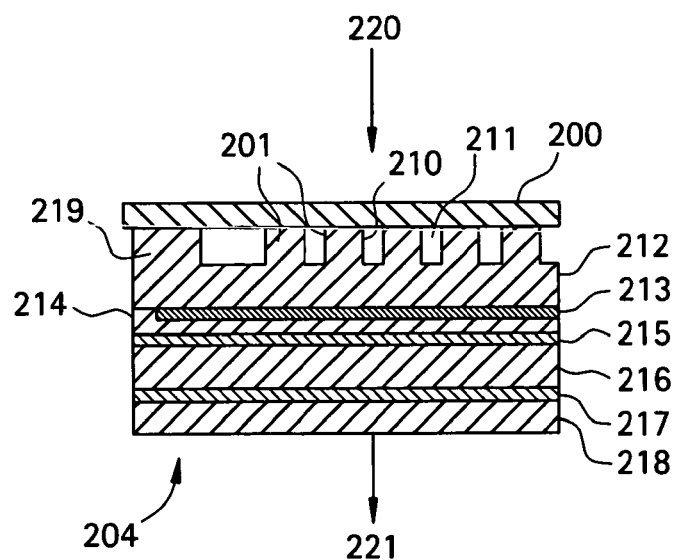
FIG. 2 is a cross-sectional view of an electrostatic chuck according to an embodiment of the invention.

In the art of electrostatic chucks, protrusions on the electrostatic chuck that contact the back side of the substrate can be referred to as mesas, bumps, pins, islands, surface structures and the like. In accordance with an embodiment of the invention, protrusions on an electrostatic chuck may have a size, spacing, and composition that allows the maintaining of a substantially uniform pressure across the surface of the substrate, and of a substantially uniform distribution of the force between the protrusions and the substrate. FIG. 2 is a cross-sectional view of an electrostatic chuck 204 according to an embodiment of the invention. The top surface of protrusions 201 contact the back side of a substrate 200, and by their support of the substrate 200, provide uniform loading and reduced levels of particles correlated with the projections 201. The protrusions 201 have side walls 210, and are separated by gaps 211. The electrostatic chuck 204 includes a dielectric layer 212 that may have protrusions 201 formed in it. Alternatively, the protrusions 201 may be formed in one or more layers of material disposed on the surface of the dielectric layer 212. One or more electrodes 213 are formed in a first layer 214, which is covered by the dielectric 212. Beneath the first layer 214 are a first adhesive layer 215, a second layer 216, an optional second adhesive layer 217, and a bottom layer 218 that contacts a cooling fluid, such as water. The dielectric layer 212 includes a gas seal annular ring 219 formed in its periphery. Process energy is received by the substrate as indicated by arrow 220; and energy is removed as indicated by arrow 221.

Figure 3:
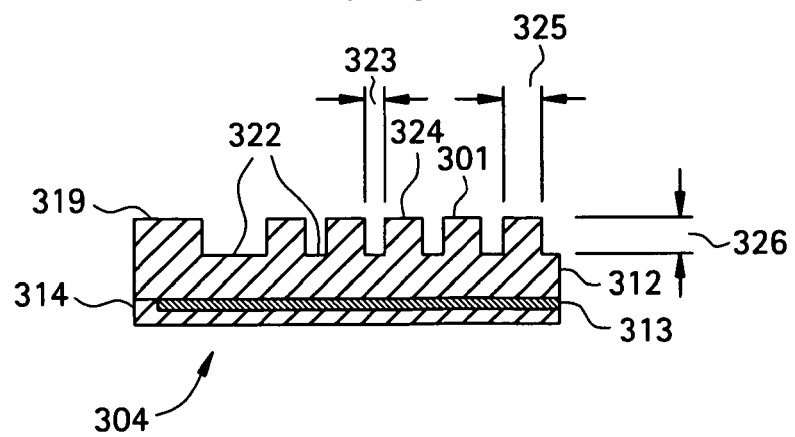
FIG. 3 is a cross-sectional view of a first layer and a dielectric layer of an electrostatic chuck according to an embodiment of the invention.

FIG. 3 is a cross-sectional view of a first layer 314 and a dielectric layer 312 of an electrostatic chuck 304 according to an embodiment of the invention. An electrode 313 in the first layer 314 is covered by the dielectric layer 312. In addition to a gas seal 319, the dielectric layer 312 includes protrusions 301. The features and dimensions of the protrusions 301 and dielectric layer 312 include a channel or gap surface bottom 322, a gap spacing 323, a protrusion top surface 324, a protrusion width or area 325, and a protrusion height 326.

In accordance with an embodiment of the invention, protrusions may be any regularly or irregularly shaped three dimensional solid or cavity, and may be disposed in any regular geometric or other pattern that substantially equally distributes force to the substrate and reduces particles due to uneven loading between the substrate and protrusions. Each protrusion may have a cylindrical side or a plurality of sides and a top. The edges of the protrusions may be square, as in the embodiment of FIG. 2, or may be contoured to help distribute the load between the substrate and chuck.

Figure 4:
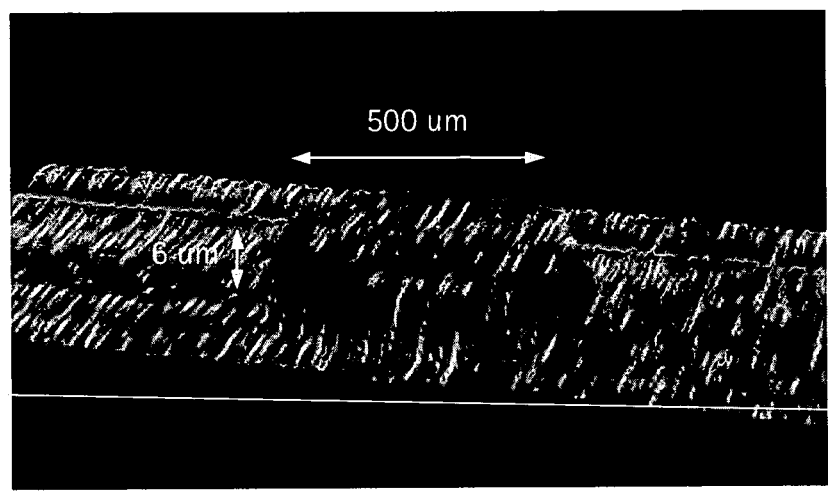
FIG. 4 is a profilometer map of a contoured dielectric protrusion on the surface of an electrostatic chuck, in accordance with an embodiment of the invention.

FIG. 4 is a profilometer map of a contoured dielectric protrusion on the surface of an electrostatic chuck, in accordance with an embodiment of the invention. The protrusion has a contour with rounded edges, which may be formed, for example, by mechanical polishing. In the embodiment of FIG. 4, the protrusion has a diameter of about 500 μm and a height of about 6 μm, although other dimensions may be used.

Figure 5A:
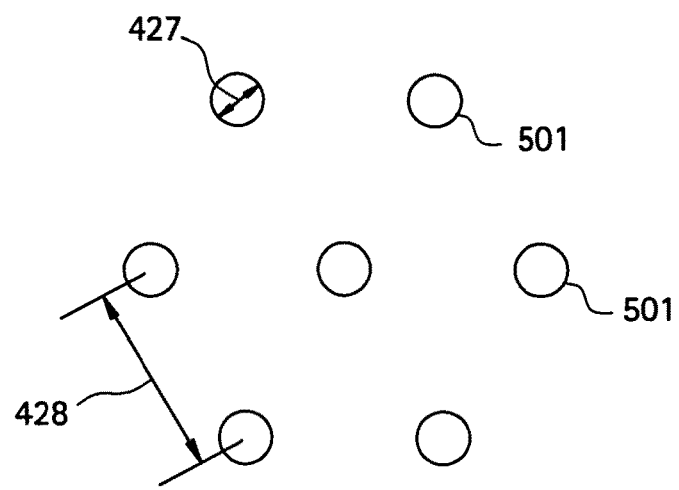
FIG. 5A is an illustration of a pattern of protrusions on the surface of an electrostatic chuck, in accordance with an embodiment of the invention.

FIG. 5A is an illustration of a pattern of protrusions 501 on the surface of an electrostatic chuck, in accordance with an embodiment of the invention, in which the protrusion pattern is used to reduce the forces between a substrate and the protrusions 501. Protrusion patterns that equally distribute such forces may be used, for example trigonal or generally hexagonal patterns of protrusions. It should be appreciated that, as used herein, a "trigonal" pattern is intended to mean a regularly repeating pattern of equilateral triangles of protrusions, such that the protrusions are substantially equally spaced apart. (Such a pattern may also be viewed as being generally hexagonal in shape, with a central protrusion in the center of an array of six protrusions that form the vertices of a regular hexagon). Forces may also be reduced by increasing the diameter 427 of the protrusions, or by decreasing the center-to-center spacing 428 of the protrusions 501. As shown in the embodiment of FIG. 5A, the protrusions may be disposed in an equally spaced arrangement, in which each protrusion is substantially equally spaced apart from the adjacent protrusions by a center to center spacing dimension 428. By virtue of such spacing, as shown in the embodiment of FIG. 2, a substantial portion of the back side of the substrate contacts the top portion of the protrusions, which may include surface roughness not shown, leaving a gap 211 between the protrusions for helium or other gas for back side cooling. By contrast, without such protrusion spacing, only a small portion, 10% or less, of the protrusions may contact the substrate. In accordance with an embodiment of the invention the substrate may contact greater than 25% of the protrusion's top surface area.

Figure 5B:
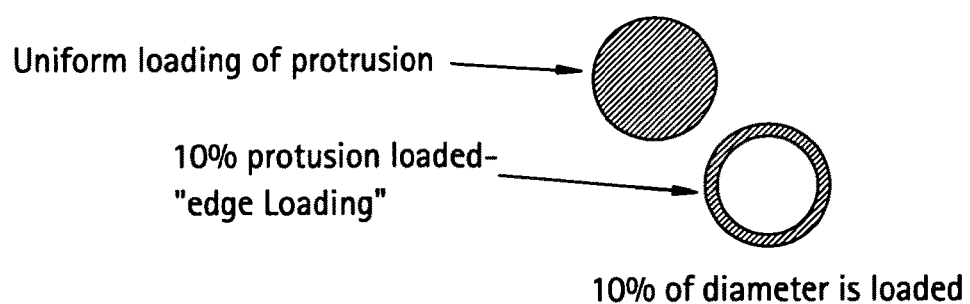
FIG. 5B is a shaded schematic diagram illustrating uniform loading of a protrusion on an electrostatic chuck, as in an embodiment according to the invention, as compared with edge loading of a protrusion, as in the prior art.

FIG. 5B illustrates the differences between uniform loading of a protrusion (as in an embodiment according to the invention) and edge loading of a protrusion (as in the prior art) on an electrostatic chuck. The shading illustrates the relative amount of loading, for both a uniform loading and a 10% edge loading (not necessarily to scale).

In accordance with an embodiment of the invention, protrusions may be either rough or polished, provided that the surface has a low stress. For example, protrusion surfaces may be polished, such as by mechanical polishing, to reduce high contact forces that occur on rough protrusion surfaces. In accordance with an embodiment of the invention, protrusions may have a peak to valley roughness of 2 microns or less Ra, in some versions 0.2 microns or less Ra Low surface roughness can provide a more uniform distribution of force across the substrate during chucking. The surface roughness may be modified by wet etching and/or blasting the surface with abrasives or beads under conditions that do not increase stress, or lead to an increase in particles correlated with the protrusions, as a result of the use of the electrostatic chuck. Such controlling of the surface finish of an electrostatic chuck may be used to control the contact regions of the protrusions with the substrate, and to control heat transfer due to physical contact between the substrate and protrusions. The amount of contact between roughened surfaces and the substrate can also be adjusted by the magnitude of the electrostatic clamping voltage.

In general, semiconductor wafers, reticles, solar cells, and other substrates or workpieces may be supported by an electrostatic chuck during use in various coating, etching, lithography, and implantation processes. Processes or uses can include chucking (attraction) and dechucking (release) of the substrate. Processes or uses can include those that result in the addition or generation of heat. In some processes the substrate piece is held in a reduced pressure environment in a vacuum chamber, for example during reactive ion-etching (ME), plasma etching, ion-beam etching, etching, physical vapor deposition (PVD), chemical vapor deposition (CVD), or other processes. During use, or during a process, an electrostatic chuck may, for example, retain a substrate in a chucking step; undergo a coating, implant or other treatment; and then release the substrate in dechucking step. These steps or acts may be repeated. In the fabrication of integrated circuits, a number of processes also involve the application of ion beams to semiconductor wafers in vacuum. These processes include, for example, ion implantation, ion beam milling and reactive ion etching. In each instance, a beam of ions is generated in a source and is accelerated toward a target substrate. One way to achieve high throughput is to use a high current ion beam so that the implantation process is completed in a relatively short time. However, large amounts of heat are likely to be generated by the high current ion beam. The heat may result in uncontrolled diffusion of impurities beyond described limits in the wafer and may result in degradation of patterned photoresist layers.

An electrostatic chuck in accordance with an embodiment of the invention may provide acceptable heat removal from a substrate as a result of use of the electrostatic chuck during a process. Generally, in various semiconducting processes, heat is generated that is transferred to the substrate. In semiconductor manufacturing, the substrate may be a semiconductor wafer upon which a number of devices are fabricated at the same time. This makes it desirable to maintain a specified temperature and temperature range, or temperature distribution, across the wafer during the process. Acceptable heat removal results in a substantially uniform temperature and temperature range, or temperature distribution, across the wafer during the process. In accordance with an embodiment of the invention, the temperature distribution across the wafer may vary by ±25° C. or less, for a substrate temperature that can be controlled to about 400° C. or less, or in some cases to about 250° C. or less, or in still other cases to about 100° C. or less. In accordance with an embodiment of the invention, a process may result in a heat input to the substrate that may range from about 1 watt/cm2 to about 8 watts/cm2. The temperature and distribution of temperatures may be measured at various different locations across the substrate, and the temperature distribution across the wafer may vary by ±5° C. or less for a substrate temperature that can be controlled to about 100° C. or less, or in some cases to about 70° C. or less, or in still other cases to about 10° C. or less. In another embodiment according to the invention, the process may result in a heat input to the substrate that may range from about 0.1 watt/cm2 to about 2 watts/cm2. In an implant application in accordance with an embodiment of the invention, the total heat load may be up to about 1500 watts (~2 w/cm2), the wafer temperature may rise to about 70° C. from room temperature, and there may be a +/−15° C. temperature variation. Further embodiments of the electrostatic chuck according to the invention may be used with higher temperature applications, such as a 400° C. heated chuck in an etch application, or with lower temperature applications, such as a room temperature application with a highly controlled temperature (+/−0.01° C.).

Generally, during a process, electrostatic chucks dissipate most of the heat from a chucked substrate in two ways: first, by gas heat conduction through a cooling gas in a gap between the substrate and electrostatic chuck dielectric; and second, by contact heat conduction, which is conduction directly across the microscopic and macroscopic points (for example protrusion roughness and protrusions respectively) of contact between surfaces at the substrate electrostatic chuck interface. The overall heat transfer coefficient of the electrostatic chuck is the series sum of the reciprocal of the heat transfer coefficients for each of the layers. If the area of the contact surfaces of the electrostatic chuck surface protrusions is increased it can become difficult to control the temperature of the semiconductor wafer above 100° C. or more, for example in a temperature range of 300° C. to 400° C. This is because the temperature of the semiconductor wafer largely decreases through the contact heat conduction from the substrate to the protrusions. The amount of heat transferred by contact heat conduction is determined by the size of the area of direct contact between contact surfaces or protrusions of the chuck and the back side of the substrate.

In an electrostatic chuck, back side gas heat conduction is the transfer of thermal energy between the substrate and chuck surface. Heat transfer can occur by conduction of heat by gas atoms or molecules between the body of the chuck and the wafer. Back side gas conduction takes place when the molecules or atoms of the gas leave the back side of the substrate with heat energy and deliver that energy to the electrostatic chuck surface. According to U.S. Pat. No. 6,839,217, gas conduction heat transfer has the disadvantage that the area of the protrusions must be strictly controlled dimensionally to match the characteristic distances of the mean free path of the gas at the pressures of the gases used. Further according to U.S. Pat. No. 6,839,217, leakage of the gas can be a problem for vacuum processes and may result in non-uniform cooling and possible degradation of the process by localized gas concentrations at the leakage areas. For a given cooling capacity, the gas pressure between the substrate and electrostatic chuck may flex the wafer and possibly degrade the integrity of the process and process yield.

In an electrostatic chuck according to an embodiment of the invention, the height of the protrusions is preferably approximately the same as, or substantially equal to, the mean free path of the gas used in back side cooling. For example, for a back side cooling gas at 10 torr (1333 Pa), the mean free path is 5 microns and accordingly the height of the protrusion should be 5 microns or about 5 microns. The mean free path depends upon gas pressure and the molecular diameter of the gas and temperature to achieve the most efficient heat conduction. The height of the protrusions may be modified to take into account process temperatures, pressure, back side gas pressure, and chucking force. In one embodiment according to the invention, the height of the protrusions is about 6 microns.

An electrostatic chuck according to an embodiment of the invention may optionally include gas inlets, gas channels and the like located across the chuck and or towards the periphery of the chuck, to distribute cooling gas to the underside of a substrate held by the chuck. The size, location, and shape of the channels and/or gas inlets distributes gas in the gap, minimizes pressure gradients, and facilitates the transfer of heat from the wafer to the chuck. The gas introduced into the spaces between the substrate and chuck provides thermal heat transfer to control the wafer temperature. At the same time, the gas pressure (2-20 torr) is low enough that the attractive or clamping force holding the substrate, 25-35 torr, is not seriously diminished. An electrostatic chuck according to an embodiment of the invention may include one or more annular shaped rings as disclosed in U.S. Pat. No. 6,608,745, near the edge or outer periphery of the chuck. These rings can have a height similar to the protrusions and a width sufficient to provide a gas seal between the substrate and ring edge. In some cases the amount of gas that can by-pass the gas seal is less than 0.2 sccm for a gas pressure between the chuck and substrate at vacuum chamber pressures less that 1 atmosphere.

An electrostatic chuck in accordance with an embodiment of the invention of the invention can be used to hold a substrate in place by electrostatic force. The substrate is separated from an electrode by an insulating dielectric layer. One or more electrodes are formed within the dielectric and covered with a layer of the dielectric. A DC voltage (for a Coulombic chuck) can be applied to the electrodes to produce electrostatic force which clamps the wafer to the chuck. In some cases an alternating current or RF power can be applied to the electrodes. (An alternating current may be applied, for example, at a frequency of 30 Hz or another frequency. When RF power is applied, which is typically only in a sputtering or etch system, the self-bias or DC-bias voltage provides the chucking force). The voltage applied to the electrode produces an electrostatic charge on the contact surface of the insulating layer of the electrostatic chuck, which produces an equal and opposite electrostatic charge on the contact surface of the substrate. The electrostatic charges on the contact surfaces of the electrostatic chuck and substrate produce an electrostatic force between them. This electrostatic force holds the substrate against the electrostatic chuck dielectric layer and any protrusions on the electrostatic chuck. Heat delivered to the substrate can be transferred by contact heat conduction and gas heat conduction to the insulating layer of the gap or channel surface bottom of the electrostatic chuck which is cooled, typically with cooling water. In use, a substrate such as a wafer, supported on three lift pins, is dropped down onto the protrusions of the electrostatic chuck and then the power or voltage for the electrostatic chuck is turned on. Cooling gas, such as helium, is introduced from a pressure controlled gas source through an array of gas inlets. The gas inlets may be connected by a manifold and hoses to a vacuum pump. A central gas inlet may also be used to allow the gas pressure to equilibrate beneath the wafer more rapidly. It can also speed up the removal of the gas at the end of wafer processing when the wafer is about to be removed from the chuck. Given the small gap between wafer and chuck, additional gas ports may be needed for this purpose. In operation, the substrate is clamped to the chuck, valves are opened and a gas such as helium is introduced from gas inlet holes under the surface of the substrate, which is supported by the protrusions of the chuck surface. At the end of processing, for example after ion implantation has occurred, the valves are opened, the coolant gas is pumped out, the electrostatic chuck power is turned off, the lift pins are raised, the effector is inserted and the substrate is removed from the chuck.

In accordance with an embodiment of the invention, an electrostatic chuck can include lift pins and ground pins. Gas sealing surfaces may be formed around these in a similar fashion to the annular gas seal ring near the edge of the electrostatic chuck. Where possible, in accordance with an embodiment of the invention, these gas sealing structures may be formed in such a way as to encourage the uniformity of the distribution of force between the substrate and chuck, for example by including portions of protrusions as discussed above.

Substrates used with an electrostatic chuck according to an embodiment of the invention can include semiconductor wafers, flat screen displays, solar cells, reticles, photomasks, and the like that are held by the electrostatic chuck. Regardless of the shape, the substrates can have an area equal to or greater than a 100 millimeter diameter wafer, a 200 millimeter diameter wafer, a 300 millimeter diameter wafer or a 450 millimeter diameter wafer.

In general, electrostatic chucks utilize the attractive force, which is similar to the force between two plates of a capacitor, to hold a substrate, such as a wafer, in place. In accordance with an embodiment of the invention, this clamping force may be in the range of 25 to 35 torr, including values within this range, such as 26 torr, 33 torr, and others. If the wafer is separated from the chuck by an insulator of dielectric constant $\square$ and thickness d, and a voltage V is applied between them, an attractive force F is generated between them as follows:

$$F = \left(\frac{\varepsilon V^2}{2d^2}\right) A$$

where A is the common area of the wafer and chuck electrode. To obtain a large attractive force for a given voltage, the distance d separating the wafer and the chuck electrode can be minimized by using a thin dielectric layer. Therefore, in accordance with an embodiment of the invention, in order to obtain a chucking force, the dielectric layer may have a thickness of, for example, from about 25 to about 250 microns. Among other considerations, the thickness of the dielectric layer is limited by the breakdown voltage of the material, which places a lower limit on the thickness. Thinner dielectric layers allow greater force to be achieved. Also high dielectric constants are an advantage for creating high force. If a gap exists between the wafer and chuck that is filled either with a low pressure gas or a vacuum, then the dielectric constant is essentially that of free space $\varepsilon_0$. It should also be noted that the dielectric layer may be a duplex structure using more than one material. For example, as discussed further below, an alumina dielectric about 100 microns thick may be coated with a silicon carbide layer about 2 microns thick, with protrusions from that surface, also silicon carbide, of 6 microns height.

As disclosed in U.S. Pat. No. 6,835,415, if the mounting surfaces of the tools allow any particulates to become entrapped between the mounting surface and a substrate such as a wafer or mask, then the wafer or mask may be deformed by the entrapped particle. For example, if a wafer is clamped, by vacuum or electrostatically, against a flat reference surface, any entrapped particles could cause a deformation of the front side of the wafer, which will therefore not lie in a flat plane. This can cause variation in implant processes and potential yield loss. Reducing the contact area of the protrusions can reduce the probability of trapping particulates.

In accordance with an embodiment of the invention, the gas introduced into the spaces between the substrate and the electrostatic chuck may provide sufficient thermal heat transfer to control the substrate temperature. At the same time, the gas pressure may be chosen to be low enough that the attractive force holding the substrate to the electrostatic chuck is not significantly diminished or overcome. The thermal conductivity of a gas is essentially independent of gas pressure as long as the mean free path of the gas molecules is small compared to the system dimensions. Cooling gases useful in accordance with an embodiment of the invention may include hydrogen, helium, argon, nitrogen, and mixtures of these and/or other gases. The back side gas pressures may be within the range of approximately greater than 0 torr to 20 torr, or in the range of about 2 torr to 15 torr. Further, in accordance with an embodiment of the invention, the temperature of the chucked substrate may be controlled by gas heat conduction by adjusting the back side gas pressure.

In accordance with an embodiment of the invention, discussed with reference to the embodiment of FIG. 2, an electrostatic chuck may include a dielectric layer 212, which includes one or more protrusions 201, overlying a first layer 214 that is insulating and may be a ceramic or ceramic composite. One or more electrodes 213 are embedded in the first layer 214 and covered with a dielectric, an amorphous dielectric, or a low stress dielectric material. One or more additional layers may be included in the electrostatic chuck that provide mechanical support to the first layer 214 and overlying dielectric 212, that aid in the removal of heat, and that may contact a cooling fluid, such as water. The dielectric layer 212 may, for example, be a low stress silicon containing dielectric. The low stress dielectric may be amorphous and vapor deposited, for example by PECVD at low temperatures. The dielectric layer 212 may have a thickness of, for example, from about 1 micrometer to about 50 micrometers, or from about 1 micrometer to about 10 micrometers. The first layer 214 is insulating and may be a ceramic, such as but not limited to alumina or aluminum nitride. The first layer 214 may have a thickness of, for example, from about 50 micrometers to about 200 micrometers, or from about 100 micrometers to about 150 micrometers. The thickness of the dielectric layers can be used to control the chucking force as described herein, with thinner layers providing a greater force. Techniques of forming a patterned electrode 213 of the kind described above are taught in U.S. Pat. No. 4,184,188 of Briglia, which is incorporated herein by reference in its entirety. Electrical connections (feedthrough) through one or more layers of the electrostatic chuck between the electrodes and external power supply are provided (not shown). Gas inlets may also be formed through one or more layers of the electrostatic chuck (not shown) with openings to the dielectric gap surface bottom. A first thermally conductive material or first adhesive layer 215 may be used to bond the first layer 214 with an underlying second layer 216, which can be a ceramic or a metal. The thermally conductive material of the first adhesive layer 215 may be an adhesive, such as but not limited to a thermoplastic, an epoxy, or another material that can bond together the first layer 214 and the second layer 216. The second layer 216 may provide mechanical support and thermal conductance and may be a ceramic, metal or other suitable material. Optionally a second thermally conductive layer or second thermally conductive adhesive layer 217 bonds together the second layer 216 and a bottom layer 218 that contacts a cooling fluid. The gap 211 and optional gas channels can be filled with a gas, such as dry air, helium, hydrogen, argon or nitrogen. A gas seal 219 helps prevent leakage of gas into the surrounding chamber.

With reference to the embodiment of FIG. 3, a cross-sectional view of an annular gas seal 319 and five protrusions 301 from a portion of the substantially equally spaced pattern of protrusions across the electrostatic chuck are shown in that figure. Each protrusion 301 is a raised surface of contact area. In one embodiment, the protrusions 301 are cylindrical and have a diameter within a range of approximately 0.5 millimeters to 1.25 millimeter, or of approximately 0.75 millimeters to 1 millimeter. A substrate 200 such as a wafer (see the embodiment of FIG. 2) contacts the dielectric 312 along the top surfaces 324 of the projections 301 which can optionally be roughened. Although the protrusions 501, 801 shown in the top views of the embodiments of FIGS. 5 and 8 are circular, it should be understood that the protrusions 301, 501, 801 can be in any shape, for example triangular, rectangular, or other shape that reduces particles due to non-uniform loading of the substrate on the protrusions.

In accordance with an embodiment of the invention, in order to contain the back side gas, a continuous annular ring can be formed at the periphery of the electrostatic chuck to provide a gas seal between the substrate and chuck. The gas seal may be a continuous circular- or feature-shaped ring at the interface between the chuck and the surrounding vacuum, and may act to hold gas behind the wafer with minimal gas leakage. The annular ring may have a slightly smaller diameter than the wafer to accommodate wafer placement tolerances, so that if the wafer is misplaced the gas seal is not breached. Where possible the gas seal structure provides uniform distribution of force between the substrate and chuck. In one embodiment, the gas seal may include portions of protrusions in order to provide uniform distribution of force. The gas conductance of the annular gas seal(s), gas inlet gas seals, and lift pin gas seals(s) depends on the roughness of the contact surfaces that create the gas seal, for example the roughness of the surface of annular ring and the roughness of the surface of the wafer that contacts annular ring. Another factor that can affect the gas seal conductance is the presence of hard particles on the contact surfaces that create the gas seal. The magnitude of the clamping force between the contact surfaces that create the seal also effects the seal conductance. In accordance with an embodiment of the invention, a low stress dielectric reduces or eliminates cracks and other surface defects that can provide particles and leak paths for various gas seals. In one embodiment, an annular gas seal provides a leak rate of about 0.5 sccm or less at a chamber pressure for example but not limited to about $10^{-6}$ torr to about $10^{-7}$ torr, a back side cooling gas pressure of for example but not limited to 4 torr to 15 torr, for a 200 millimeter wafer of roughness of about 10 nanometers (nm) Ra, a gas seal roughness of for example but not limited to about 200 nm to about 300 nm Ra, a potential difference of for example but not limited to 1000 volts across the substrate and electrode.

Example 1

This example illustrates calculated forces for a trigonal pattern of 6 micron high bumps or protrusions, formed on the surface of an electrostatic chuck in accordance with an embodiment of the invention. As shown in the embodiment of FIG. 8, on example includes protrusions 801 that feature a 4 millimeter center to center spacing 827 and a diameter 828 of 0.75 millimeters. In the embodiment of FIG. 8, the protrusions 801 may be made from 10 micron thick SiC vapor deposited from Si and C sources by PECVD on an alumina dielectric layer. The SiC has a low stress. The SiC layer may be etched by reactive ion etching through a 30 micron photomask to form the protrusions. Gas seal rings may be formed around the perimeter of the electrostatic chuck, and around the lift and ground pin holes of the electrostatic chuck. Gas ports for adding and removing a gas, such as helium or hydrogen or another fluid for gas heat transfer may be formed in the chuck.

FIG. 6 is a graph of calculated force between a wafer and electrostatic chuck protrusions for various protrusion diameters and center to center bump spacing, in accordance with an embodiment of the invention. The calculated values assumes a load uniformly distributed over the protrusion surface; however, it is also possible to calculate the force using percent loadings to account for wafer lift (for example 10%, 20%, 27% or other portion of force due to edge loading). The results show that 0.75 mm and 1 mm diameter protrusions in a trigonal pattern result in lower force between the substrate and protrusions than similar protrusions having a 0.25 mm or 0.5 mm diameter. The results also show the non-linear relationship between protrusion spacing and force, and the non-linear relationship between protrusion diameter and force. As a particular example, the distributed average force for the protrusions 801 of the embodiment of FIG. 8 may be compared with the forces for other protrusions using the graph of FIG. 6. The 0.75 mm protrusions 801 of the embodiment of FIG. 8 are about 50% larger compared to 0.5 mm protrusions and result in an approximately eight times lower distributed average force, as shown in FIG. 6, compared to a square pattern of protrusions spaced 8 mm apart and having a diameter of 0.5 mm, for which the calculated force is indicated by a star in FIG. 6. The 0.75 mm protrusions of the embodiment of FIG. 8 are about 50% larger compared to 0.5 mm protrusions and result in an eight times higher contact area. The contact area for the protrusions 801 of the embodiment of FIG. 8 may be less than or equal to 4% and greater than 1%. This range provides reduced average force between the wafer and protrusions and less wafer bowing, while maintaining a 25-35 torr wafer holding force (clamping force) and is expected to have no significant effect on the cooling efficiency of the wafer.

FIG. 7 is a graph of calculated contact area for different protrusion diameters and center to center protrusion spacings, in accordance with an embodiment of the invention. The arrow points to a calculated contact area of 0.36% for a protrusion spacing of 0.5 mm and a square pattern of protrusions.

Example 2

This example describes a trigonal pattern of protrusions that was formed on the surface of an electrostatic chuck, with 8 millimeter center to center spacing between protrusions in accordance with an embodiment of the invention. The diameter of the protrusions was 0.5 millimeters. The protrusions on the platen of the electrostatic chuck were divided into three sections and made from different materials (SiC, a non-stoichiometric SiC deficient in carbon, and an Si section). The individual sections were made by PECVD of suitable precursor gases deposited on an alumina dielectric layer. The sections were etched by reactive ion etching through a 30 micron photomask to form the protrusions. Gas seal rings may be formed around the perimeter of the electrostatic chuck and around the lift and ground pin holes of the electrostatic chuck. Gas ports for adding and removing a gas, such as helium or hydrogen or another fluid for gas heat transfer, may be formed in the chuck.

FIGS. 9A and 9B are graphs of a cross-sectional profile of a protrusion on an electrostatic chuck with and without (FIGS. 9A and 9B respectively) an added stage of machine polishing, in accordance with an embodiment of the invention. In this embodiment, it has been recognized that adding an additional stage of machine polishing of the top surface of a protrusion provides significant unexpected performance benefits by reducing particle production, and results in 1) a different protrusion edge geometry; and 2) a significantly improved surface roughness. More particularly, a production process without added machine polishing uses hand polishing only, for example by polishing the top surface of an electrostatic chuck protrusion by hand with 600 grit silicon paper. A profile of the resulting protrusion is shown in FIG. 9A, in accordance with an embodiment of the invention. As can be seen, the profile of the top surface 929 features some roughness. In addition, the edge geometry indicates a relatively long rounding height dimension 930, with a relative short rounding length dimension 931. In an improved embodiment, the hand polishing of the protrusion is supplemented with machine polishing, for example using machine pad polishing. Such machine pad polishing may be performed at a specified pressure for a specified time. Further, machine polishing may include lapping, such as use of a lapping machine in a polishing mode, and may include use of a soft or hard polishing pad, with use of any suitable polishing media such as polishing media that includes diamond. A profile of the resulting protrusion is shown in FIG. 9B, in accordance with an embodiment of the invention. It will be seen that the profile of the top surface 932 is smoother by comparison with the roughness 929 of the hand polished protrusion of FIG. 9A. Further, the protrusion of FIG. 9B features a modified edge geometry, with a shorter rounding height dimension 933 by comparison with the corresponding height 930 of FIG. 9A, and a longer rounding length dimension 934 by comparison with the corresponding height 931 of FIG. 9B.

Thus, the machine pad polishing of the embodiment of FIG. 9B provides both a reduced surface roughness and a modified edge geometry by comparison with a protrusion that is only hand polished. For example, in one embodiment, the machine pad polished protrusion of FIG. 9B may show about a 50% reduction in a surface roughness metric, such as Ra, which is a measure of average of roughness height, by comparison with such a metric for a hand polished protrusion. The reduction may be, for example, from a surface roughness of about 100 nm to about 50 nm.

Figure 10A:
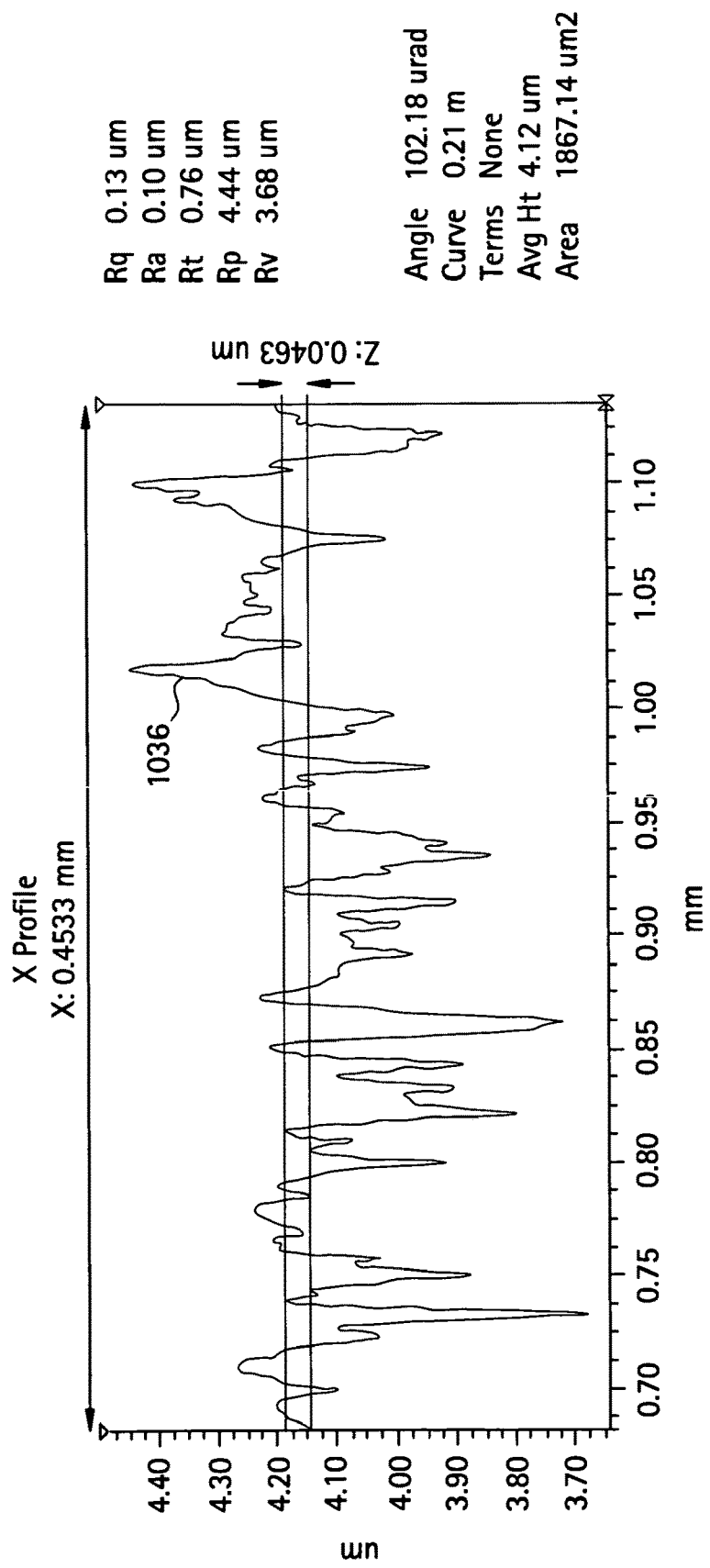
FIGS. 10A and 10B are close-up graphs of the cross-sectional profiles of the protrusions of FIGS. 9A and 9B, respectively, in accordance with an embodiment of the invention.
Figure 10B:
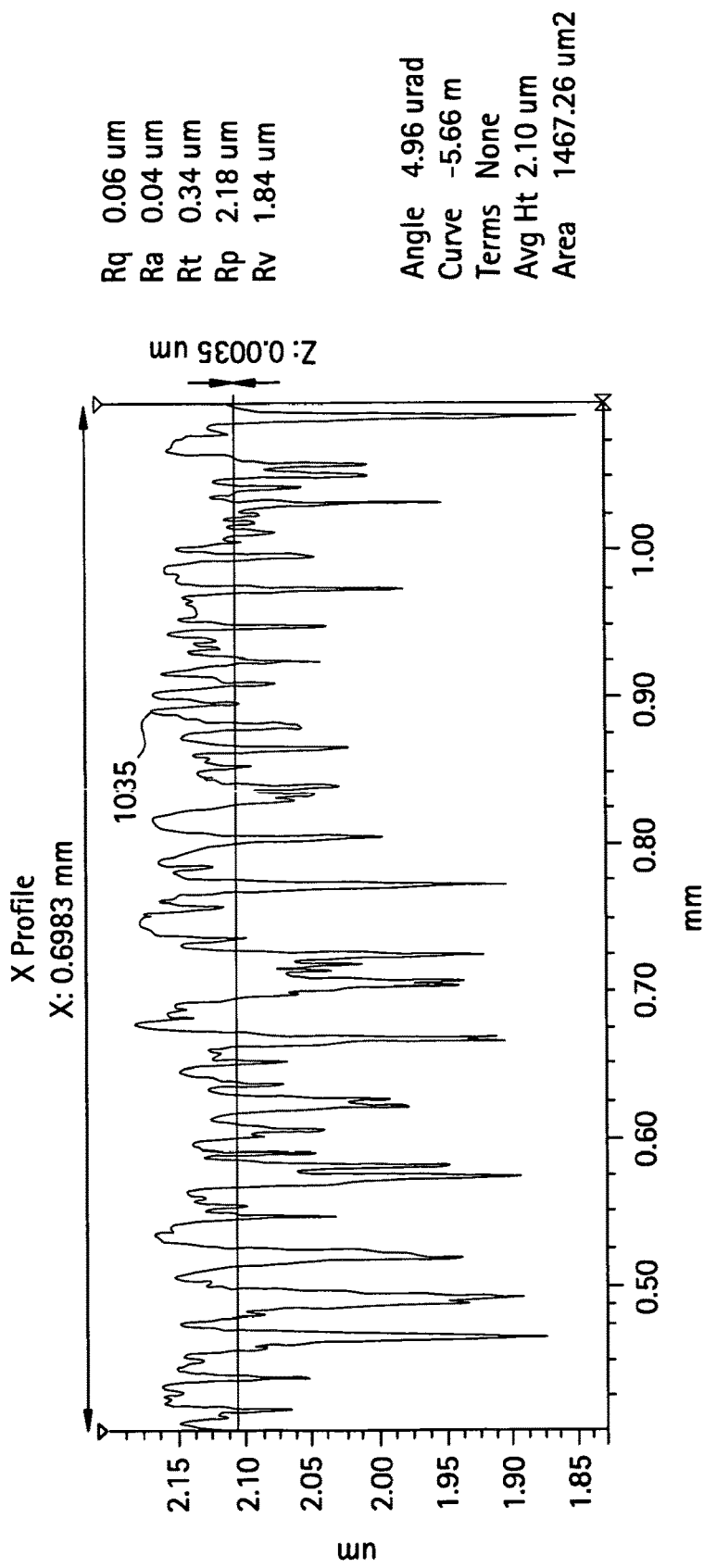

FIGS. 10A and 10B are close-up graphs of the cross-sectional profiles of the protrusions of FIGS. 9A and 9B, respectively, in accordance with an embodiment of the invention. It can be seen that, as a result of the machine pad polishing of the protrusion of FIG. 10B, the peaks 1035 of the machine pad polished protrusion of FIG. 10B are lower than the peaks 1036 of the hand polished protrusion of FIG. 10A (although the troughs may not be affected), so that an overall surface roughness metric, such as Ra, is reduced. For example, the surface roughness Ra may be reduced from about 0.10 μm in FIG. 10A to about 0.04 μm in FIG. 10B. More generally, a surface roughness metric may be reduced by about 50%, or by between 25% and 75%, by machine pad polishing of the surface of a protrusion. Further, by virtue of the machine pad polishing, there may be observed a modified edge geometry of the protrusion, such as a shorter rounding height dimension by comparison with the corresponding height of a similar hand polished protrusion, and a longer rounding length dimension by comparison with the corresponding length of a similar hand polished protrusion. For example, a ratio of a characteristic rounding height dimension to a characteristic rounding length dimension of the edge of the protrusion may be reduced by a factor of, for example, between 3 and 4, such as a reduction from a ratio of 0.01222 to a ratio of 0.0034 (i.e., in that case, a ratio reduced by a factor of roughly 3.59) for a height/length of 0.7802 μm/0.0638 mm when polished only by hand as compared with 0.3525 μm/0.1035 mm when machine pad polished; or by a factor between 2 and 5. It should be noted that a similarly modified edge geometry may also be obtained without machine polishing. In one embodiment, a modified edge geometry such as that of FIG. 10B, which features a relatively shorter rounding height dimension and a relative longer rounding length dimension, may be achieved by any edge-modification technique to produce the desired rounding height to rounding length ratio. For example, a ratio of a characteristic rounding height dimension and a characteristic rounding length dimension of between about 0.00407 and about 0.00306, or between about 0.00611 and about 0.002444, may be used.

In addition, by virtue of the machine pad polishing of a protrusion in accordance with an embodiment of the invention, an electrostatic chuck may have an improved performance by producing fewer back side particles in use with a substrate, such as a semiconductor wafer. For example, fewer than 5000 particle adders, or fewer than 2000 particle adders, may be generated in a particle size range of 0.16 μm or greater. Such a reduced production of back side particles may be accompanied by a lack of impact on thermal characteristics, even with an increase in contact area between protrusions and substrate, such as an increase of up to ten times in contact area.

Figure 11:
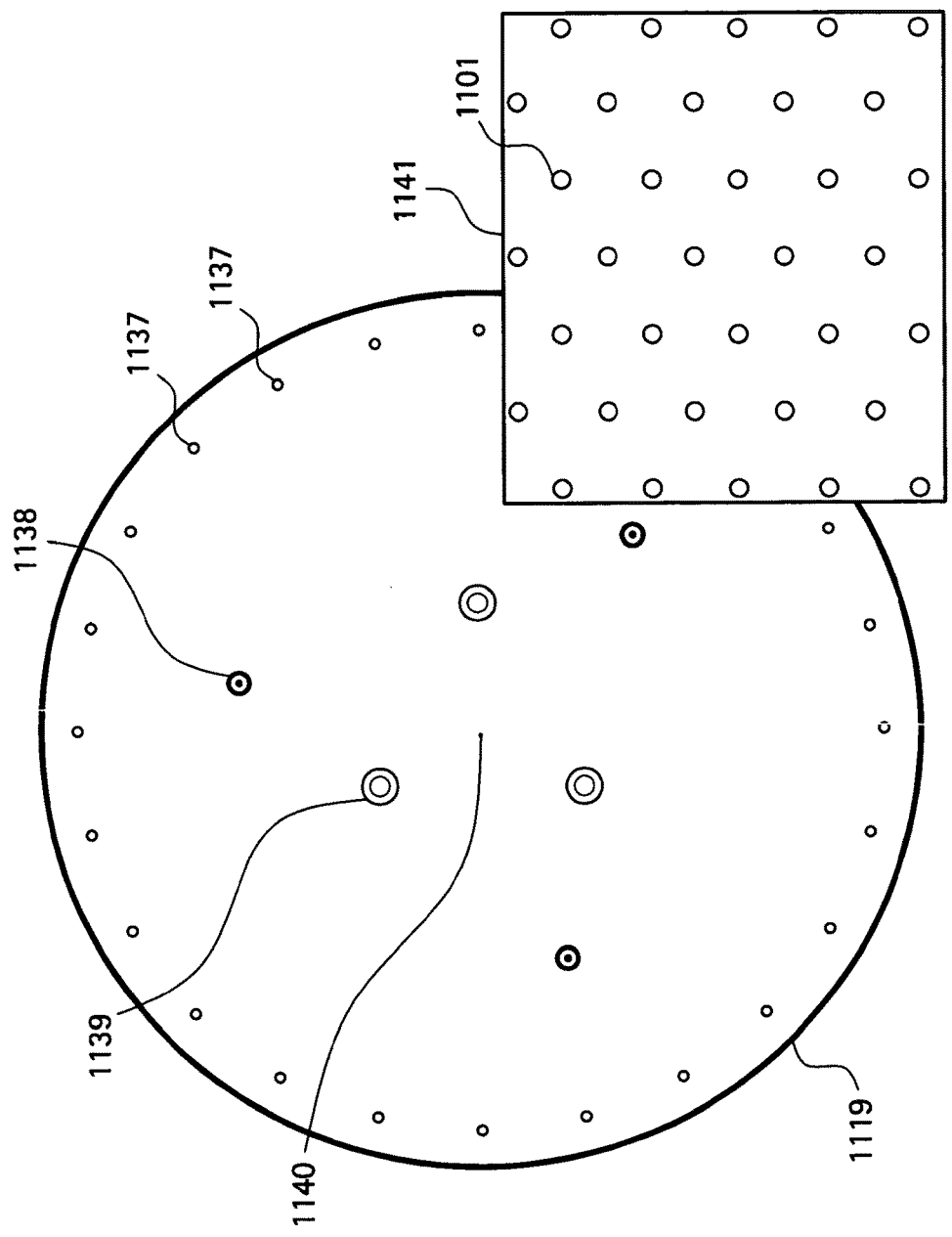
FIG. 11 shows an electrostatic chuck that includes a charge control surface layer, according to an embodiment of the invention.

FIG. 11 shows an electrostatic chuck that includes a charge control surface layer, according to an embodiment of the invention. In this embodiment, a surface layer having a controlled surface resistivity is used to reduce the likelihood of "wafer sticking," which occurs when a wafer or other substrate electrostatically adheres to the chuck surface after the chuck power is removed. A surface layer having a surface resistivity in an appropriate range, such as, for example, a range of from about 1×108 ohms/square to about 1×1011 ohms/square, has been shown to reduce surface charge retention that can lead to undesirable electrostatic force and ultimately to wafer sticking. The slightly conductive surface layer bleeds charge to ground (not shown) while not interfering with the electrostatic attraction between the electrostatic chuck and the substrate.

The electrostatic chuck of the embodiment of FIG. 11 has been tested in an ion implant machine with good results for wafer cooling and clamp force, and with low particle generation and minimal wafer damage. In particular, there was less than a 50° C. rise in temperature of the platen from the 1800 watts power incident on the platen from the ion implant beam, and after testing, less than 5000 adders of a size greater than 0.12 microns were found on the platen. Because of the materials used to make the protrusions, in particular a silicon carbide coating, and the intrinsic controlled bulk resistivity of the coating, wafers were less likely to electrostatically adhere to the chuck surface after the chuck power was removed.

In the example of the embodiment of FIG. 11, the wafer contact surface was built on a 300 mm diameter Coulombic-type chuck that employed alumina ceramics for the insulator and dielectric materials. A six-phase alternating current power supply was used to charge and discharge the chuck in a manner described in U.S. Pat. No. 6,388,861, the contents of which are incorporated herein by reference. Specifically, as described at Col. 4, line 66 through Col. 5, line 23 of U.S. Pat. No. 6,388,861, the chuck includes six electrodes, and bipolar square wave clamping voltages having six different phases are applied to the electrodes. It will be appreciated that other power supplies (such as DC power supplies) and techniques for charging and discharging the chuck may be used. The electrostatic chuck surface includes gas inlets 1137, a ground pin passage 1138, a gas seal ring 1119, a lift pin passage 1139 that includes its own gas seal ring (outer light-colored structure of lift pin passage 1139 in FIG. 11), and a small gas inlet at 1140 in the center of the chuck (inlet not visible in FIG. 11). A detail view (inset 1141 in FIG. 11) shows the protrusions 1101.

Figure 12:
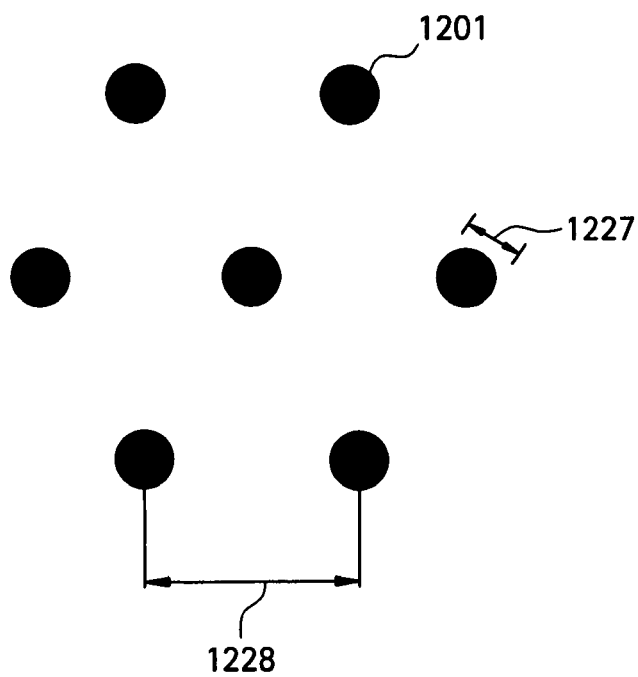
FIG. 12 shows the surface pattern used for the protrusions in the electrostatic chuck of the embodiment of FIG. 11.

FIG. 12 shows the surface pattern used for the protrusions 1201 in the electrostatic chuck of the embodiment of FIG. 11. The protrusions 1201 were made in a triangular pattern with a center-to-center spacing 1228 of 4 mm and a diameter 1227 of 800 microns (0.8 mm). The protrusions 1201 had a height 1326 (see FIG. 13) of 5 to 7 microns, which is considered optimum for operation with back side gas of 15 torr pressure. The controlled surface resistivity layer was a silicon carbide coating produced by a plasma assisted physical vapor deposition (PACVD) process, although other suitable processes may be used. For example, the layer may also be deposited by physical vapor deposition (PVD) (sputtering from a SiC target or reactively sputtered from a silicon target in a carbon reactive gas), atomic layer deposition (ALD), high temperature CVD or other thin film methods.

Figure 13:
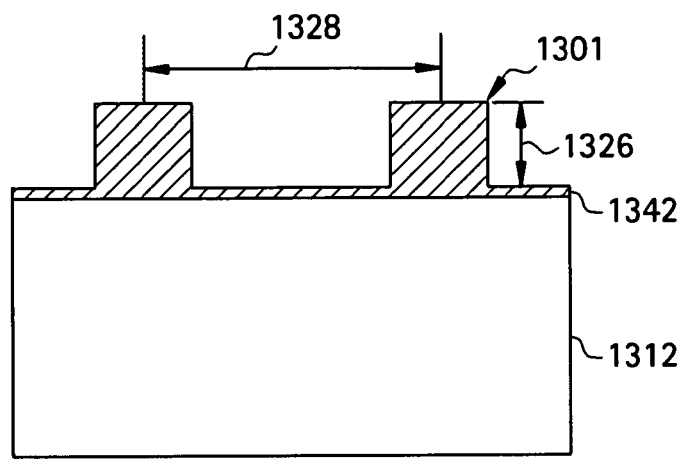
FIG. 13 is a schematic cross-sectional view of the substrate contact surface of the embodiment of FIG. 11.

The protrusions 1201 were made by blanket depositing a silicon carbide composition, such as silicon carbide or non-stoichiometric silicon carbide, on the flat alumina dielectric 1312 (see FIG. 13), patterning the silicon carbide composition using photolithography, and then removing portions of the silicon carbide composition with reactive ion etching to leave the protrusions 1301 (see FIG. 13). The resistivity of the silicon carbide composition (which may be either silicon carbide or non-stoichiometric silicon carbide) was controlled by varying the amount of silicon precursor gas and carbon precursor gas used to make the silicon carbide composition and to achieve silicon carbide or non-stoichiometric silicon carbide with a surface resistivity in the range of from about 1×108 ohms/square to about 1×1011 ohms/square. For example, the composition of the silicon carbide composition may be varied by adjusting the flow rates or ratios of silicon- and carbon-containing precursor gases that are input into a reactor of a plasma-enhanced CVD process. The precursor gases decompose and form a coating on the electrostatic chuck, with the composition of the silicon carbide coating being determined by the relative flow rates or ratios of the precursor gases. The surface resistivity of the coating can be varied by varying the composition of the coating.

Other low stress coatings with the same surface resistivity range could be similarly deposited on the alumina and patterned. For example, coatings with an internal compressive film stress of less than about 450 MPa, and more preferably less than about 450 MPa (as deposited) may be used. Further, the coatings may be formed with a low stress material (such as one with an internal compressive film stress in a range of less than about 450 MPa), and then overcoated with a thin coating of diamond-like carbon (or other material that typically has a higher compressive film stress) to achieve the desired surface resistivity. FIG. 13 is a schematic cross-sectional view of the substrate contact surface of the embodiment of FIG. 11. The dielectric material 1312 is alumina, and the protrusion 1301 material is silicon carbide, which is chosen for its high hardness and adjustable bulk resistivity. The silicon carbide protrusion 1301 and coating layer 1342 has a bulk resistivity of about $1 \times 10^8$ ohm-cm, which results in a surface resistivity of about $1 \times 10^{10}$ ohms per square. Surface resistivity in the range of from about $1 \times 10^8$ ohms/square (made using a non-stoichiometric silicon carbide composition that is richer in carbon) to about $1 \times 10^{11}$ ohm/square (made using a non-stoichiometric silicon carbide composition that is richer in silicon) has been shown to reduce surface charge retention that can lead to undesirable electrostatic force and ultimately wafer sticking. The coating layer 1342 can be from about 0.1 to about 10 microns thick, but is preferably from about 1 to about 3 microns thick. A center-to-center spacing 1328 of 4 mm is shown, but other spacings may be used.

Another feature of the electrostatic chuck of the embodiment of FIG. 11 is a continuous ring 1119 (see FIG. 11) of silicon carbide at the same height from the chuck plane as the protrusions that circles the entire chuck at the edge and also circles the larger through holes in the center of the chuck. These rings act to contain the back side gas when the wafer is electrostatically attracted to the surface.

Figure 14:
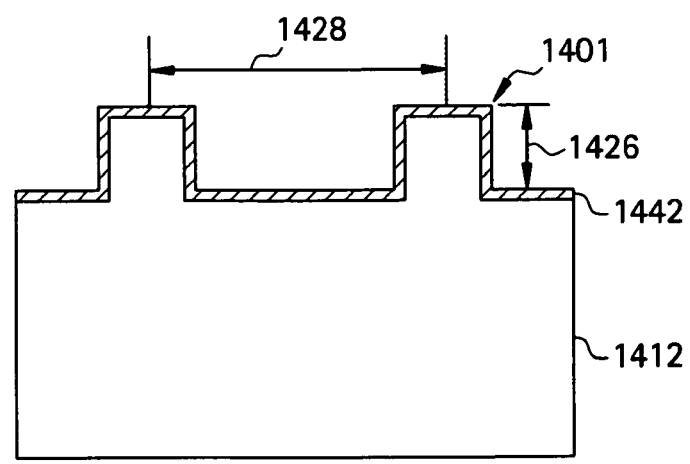
FIG. 14 shows an alternative version of the coating for the electrostatic chuck of FIG. 11 in which a conformal coating of charge control material is used, in accordance with an embodiment of the invention.

FIG. 14 shows an alternative version of the coating for the electrostatic chuck of FIG. 11 in which a conformal coating 1442 of charge control material is used, in accordance with an embodiment of the invention. The alumina dielectric 1412 (electrodes not shown) can be patterned first by bead blasting or by using an etching technique to form protrusions 1401, gas seals and the like. The dielectric 1412 can then be coated, essentially conformally, with the silicon carbide or other charge control material layer 1442 that has a surface resistivity in the range of from about $1 \times 10^8$ ohms/square to about $1 \times 10^{11}$ ohms/square. The embodiment of FIG. 14 may have the advantage of lower manufacturing cost than that of FIG. 13. A protrusion height 1426 of 5 to 7 microns and spacing 1428 of 4 mm is shown, but other protrusion heights and spacings may be used.

In accordance with the embodiments of FIGS. 11-14, a surface resistivity in the range of from about $1 \times 10^8$ ohms/square to about $1 \times 10^{11}$ ohms/square is preferable for the charge control surface layer 1301/1342, 1442. Preferably, the charge control surface layer should be a non-parasitic conductive layer, since a parasitic conductive layer would undesirably couple the electrostatic force of the electrostatic chuck to the charge control surface layer rather than to the substrate. By keeping the surface resistivity of the charge control surface layer in the range of from about $1 \times 10^8$ ohms/square to about $1 \times 10^{11}$ ohms/square, the electrostatic force of the electrostatic chuck is coupled to the substrate rather than to the surface layer itself. If the surface layer has a surface resistivity that is either too far above or too far below this range, there is a risk of either a reduction in clamping force of the electrostatic chuck, or of insufficient charge bleeding from the surface of the chuck and an increased tendency for wafer sticking to occur.

Other materials than silicon carbide compositions may be used to form the charge control surface layer, in accordance with an embodiment of the invention. For example, diamond-like carbon, amorphous silicon, metal-doped oxides or other materials may be used. Preferably, the charge control surface layer should have a surface resistivity in the range of from about $1 \times 10^8$ ohms/square to about $1 \times 10^{11}$ ohms/square, regardless of the material used. The material used for the charge control surface layer should be thermally and chemically stable, while also having a surface resistivity in the appropriate range. A surface resistivity range of from about $1 \times 10^6$ ohms/square to about $1 \times 10^{10}$ ohms/square could be achieved with diamond-like carbon, for example, although preferably a range of from about $1 \times 10^8$ ohms/square to about $1 \times 10^{11}$ ohms/square should be used. Diamond-like carbon can preferably be used with the manufacturing technique of FIG. 13, in which blanket depositing is used; and is preferably used in a thin layer. Generally, for a given bulk resistivity material, a thinner layer produces a higher surface resistivity and vice versa. In general, the composition and thickness of the charge control surface layer should be adjusted to achieve the appropriate surface resistivity.

In accordance with an embodiment of the invention, use of an electrostatic chuck can include the acts or steps of chucking, de-chucking, performing a microelectronic manufacturing process on a chucked wafer, and combinations including any of these.

It should be noted that as used herein and in the appended claims, the singular forms "a", "an", and "the" include plural reference unless the context clearly dictates otherwise. Thus, for example, reference to a "protrusion" is a reference to one or more protrusions and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about" or "substantially" whether or not explicitly indicated. The term "about" or "substantially" generally refers to a range of numbers that one of skill in the art would consider equivalent to the recited value (i.e., having the same function or result). In some embodiments the term "about" or "substantially" refers to ±10% of the stated value, in other embodiments the term "about" or "substantially" refers to ±2% of the stated value. While compositions and methods are described in terms of "comprising" various components or steps (interpreted as meaning "including, but not limited to"), the compositions and methods can also "consist essentially of" or "consist of" the various components and steps. "Consist essentially of" or "consist of" should be interpreted as defining essentially closed-member groups.

While this invention has been particularly shown and described with references to example embodiments thereof, it will be understood by those skilled in the art that various changes in form and details may be made therein without departing from the scope of the invention encompassed by the appended claims.

What is claimed is:

1. An electrostatic chuck comprising:
   an electrode; and a surface layer activated by a voltage in the electrode to form an electric charge to electrostatically clamp a substrate to the electrostatic chuck, the surface layer including:
(i) a dielectric comprising a bulk resistivity greater than about $10^{12}$ ohm-cm;
(ii) a plurality of protrusions extending to a height above portions of the surface layer surrounding the protrusions to support the substrate upon the protrusions during electrostatic clamping of the substrate, the protrusions being substantially equally spaced across the surface layer as measured by a center to center distance between pairs of neighboring protrusions, the protrusions comprising a low stress material having an internal compressive film stress less than about 450 MPa and comprising an overcoating of diamond like carbon; and
(iii) a charge control surface layer coating overlying the dielectric and comprising a thickness in the range of from about 0.1 microns to about 10 microns and a surface resistivity in the range of from about $1\times10^8$ ohms/square to about $1\times10^{11}$ ohms/square, the charge control surface layer comprising a surface coating layer comprising portions of the surface layer surrounding the protrusions, above which the protrusions extend.

2. The electrostatic chuck of claim 1, wherein the protrusions are arranged in a trigonal pattern.

3. The electrostatic chuck of claim 1, wherein greater than about 75% of a top area of each of the protrusions contacts the substrate during the electrostatic clamping.

4. The electrostatic chuck of claim 1, wherein the low stress material comprises at least one of an amorphous dielectric material and a polycrystalline dielectric material.

5. The electrostatic chuck of claim 1, wherein the protrusions comprise a dielectric material, wherein the dielectric material is silicon, an alloy of silicon, silicon carbide, or non-stoichiometric silicon carbide.

6. The electrostatic chuck of claim 1, wherein the protrusions comprise a dielectric material, wherein the dielectric material is alumina or aluminum nitride.

7. The electrostatic chuck of claim 1, wherein the protrusions comprise a compliant dielectric material.

8. The electrostatic chuck of claim 1, wherein a contact area of the protrusions with the substrate comprises from about 1% to about 10% of a total area of the electrostatic chuck.

9. The electrostatic chuck of claim 1, wherein the center to center distance between pairs of neighboring protrusions is less than about 8 millimeters.

* * * * *